(12) United States Patent
Sasaoka

(10) Patent No.: US 8,350,388 B2
(45) Date of Patent: Jan. 8, 2013

(54) COMPONENT BUILT-IN WIRING BOARD AND MANUFACTURING METHOD OF COMPONENT BUILT-IN WIRING BOARD

(75) Inventor: Kenji Sasaoka, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 138 days.

(21) Appl. No.: 12/740,694

(22) PCT Filed: Oct. 29, 2008

(86) PCT No.: PCT/JP2008/069678
§ 371 (c)(1),
(2), (4) Date: Aug. 20, 2010

(87) PCT Pub. No.: WO2009/057654
PCT Pub. Date: May 7, 2009

(65) Prior Publication Data
US 2010/0301473 A1    Dec. 2, 2010

(30) Foreign Application Priority Data

Nov. 1, 2007 (JP) ................... P2007-284754
Nov. 22, 2007 (JP) ................... P2007-302883
Dec. 13, 2007 (JP) ................... P2007-322062

(51) Int. Cl.
*H01L 23/485* (2006.01)
(52) U.S. Cl. ........ 257/773; 257/723; 257/737; 257/741; 257/E21.505; 257/E21.507
(58) Field of Classification Search ................... 257/723, 257/737, 741, 773, 774, E23.141, E21.505, 257/E21.507
See application file for complete search history.

(56) References Cited

U.S. PATENT DOCUMENTS
5,703,400 A * 12/1997 Wojnarowski et al. ....... 257/723
(Continued)

FOREIGN PATENT DOCUMENTS
EP      1 304 742 A2    4/2003
(Continued)

OTHER PUBLICATIONS
International Search Report prepared by the Japanese Patent Office in PCT/JP2008/069678, dated Feb. 3, 2009.
(Continued)

*Primary Examiner* — Allan R Wilson
(74) *Attorney, Agent, or Firm* — Finnegan, Henderson, Farabow, Garrett & Dunner, L.L.P.

(57) ABSTRACT

Disclosed is a component built-in wiring board, including a first insulating layer; a second insulating layer positioned in a laminated state on the first insulating layer; a semiconductor element buried in the second insulating layer, having a semiconductor chip with terminal pads and having surface mounting terminals arrayed in a grid shape connected electrically with the terminal pads; an electric/electronic component further buried in the second insulating layer; a wiring pattern sandwiched between the first insulating layer and the second insulating layer, including a first mounting land for the semiconductor element and a second mounting land for the electric/electronic component; a first connecting member connecting electrically the surface mounting terminal of the semiconductor element with the first mounting land; and a second connecting member connecting electrically the terminals of the electric/electronic component with the second mounting land, made of a same material as a material of the first connecting member.

10 Claims, 19 Drawing Sheets

U.S. PATENT DOCUMENTS

| | | | | |
|---|---|---|---|---|
| 5,874,782 | A * | 2/1999 | Palagonia | 257/778 |
| 5,875,100 | A * | 2/1999 | Yamashita | 361/764 |
| 6,955,948 | B2 * | 10/2005 | Asahi et al. | 438/125 |
| 7,091,593 | B2 * | 8/2006 | Ishimaru et al. | 257/686 |
| 7,122,901 | B2 * | 10/2006 | Sunohara et al. | 257/758 |
| 2003/0090883 | A1 | 5/2003 | Asahi et al. | |
| 2005/0006142 | A1 * | 1/2005 | Ishimaru et al. | 174/262 |
| 2005/0151246 | A1 * | 7/2005 | Daeche et al. | 257/723 |
| 2005/0269681 | A1 | 12/2005 | Asahi et al. | |
| 2006/0170098 | A1 * | 8/2006 | Hsu | 257/723 |
| 2006/0223231 | A1 | 10/2006 | Koiwa et al. | |
| 2009/0041994 | A1 | 2/2009 | Ockenfuss et al. | |

FOREIGN PATENT DOCUMENTS

| | | |
|---|---|---|
| JP | 03-006828 A | 1/1991 |
| JP | 2000-269269 A | 9/2000 |
| JP | 2001-044641 A | 2/2001 |
| JP | 2001-044642 A | 2/2001 |
| JP | 2002-270989 A | 9/2002 |
| JP | 2003-86626 | 3/2003 |
| JP | 2003-197849 | 7/2003 |
| JP | 2003-526937 A | 9/2003 |
| JP | 2004-134669 | 4/2004 |
| JP | 2006-294650 | 10/2006 |
| JP | 2007-35689 | 2/2007 |
| JP | 2007-266196 A | 10/2007 |
| JP | 2007-281160 A | 10/2007 |
| JP | 2007-295008 A | 11/2007 |
| JP | 2007-305636 A | 11/2007 |
| WO | WO-01/68311 A1 | 9/2001 |
| WO | WO 2007/003414 A1 | 1/2007 |
| WO | WO 2007/037086 A1 | 4/2007 |

OTHER PUBLICATIONS

Japanese Notice of Reasons for Refusal issued in Japanese Patent Application No. 2007-284754, mailed Jan. 17, 2012, along with five-page English translation.

Japanese Notice of Reasons for Refusal issued in Japanese Application No. 2007-302883, mailed Jan. 17, 2012, along with five-page English translation.

Notice of Reasons for Refusal issued by the Japanese Patent Office on Aug. 14, 2012, for Japanese Patent Application No. 2007-284754, and English-language translation thereof.

Notice of Reasons for Refusal issued by the Japanese Patent Office on Oct. 23, 2012, for Japanese Patent Application No. 2007-322062, and English-language translation thereof.

* cited by examiner

FIG. 12A

| Type | Test chip |
|---|---|
| Chip size | 3.0mm×3.0mm |
| Chip thickness | 200 μm |
| Number of terminals | 30 pins |
| Terminal pitch | 300 μm |
| Bump | Au stud bumps |

FIG. 12B

| | Connection resistance mΩ/bump | | Initial conduction evaluation | Conduction evaluation after thermal shock test |
|---|---|---|---|---|
| With roughening treatment | Average | 1.5 | Number of NG occurrence 0/100 (NG occurrence rate 0%) | Number of NG occurrence 0/100 (NG occurrence rate 0%) |
| | Max. | 2.5 | | |
| | Min. | 0.8 | | |
| Without roughening treatment | Average | 7.0 | Number of NG occurrence 15/100 (NG occurrence rate 15%) | Number of NG occurrence 15/75 (NG occurrence rate 20%) |
| | Max. | 25.0 | | |
| | Min. | 1.2 | | |

∗ Number of NG occurrence denotes the number of samples in the prepared 100 samples or 75 samples.

∗ Thermal shock test was preformed for 1000 cycles with each cycle consisting of -55°C for 30 minutes and 125°C for 30 minutes.

FIG. 13

| With/without roughening treatment | Without roughening treatment | Roughening treatment 1 | Roughening treatment 2 | Roughening treatment 3 | Roughening treatment 4 |
|---|---|---|---|---|---|
| Surface roughness | Rz=0.2 μm | Rz=0.45 μm | Rz=0.75 μm | Rz=1.5 μm | Rz=2.5 μm |
| Number of NG occurrence | 15/100 | 1/100 | 0/100 | 0/100 | 0/100 |
| NG occurrence rate | 15% | 1% | 0% | 0% | 0% |

*Number of NG occurrence denotes the number of samples in 100 samples.

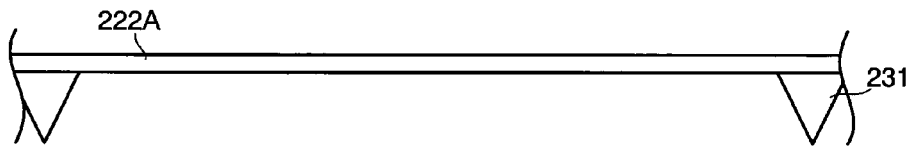
FIG. 16A
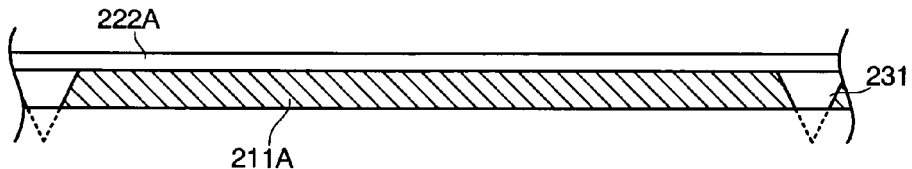
FIG. 16B
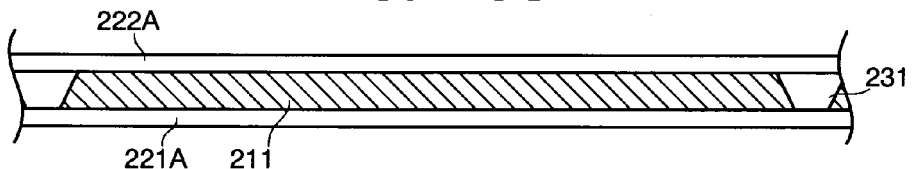
FIG. 16C
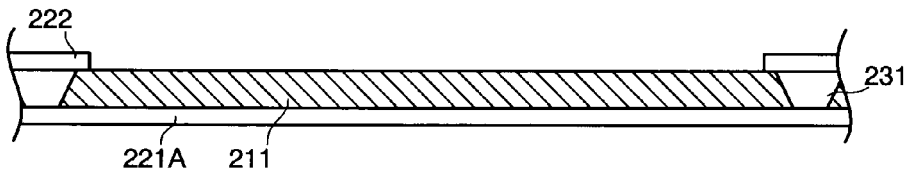
FIG. 16D
FIG. 16E
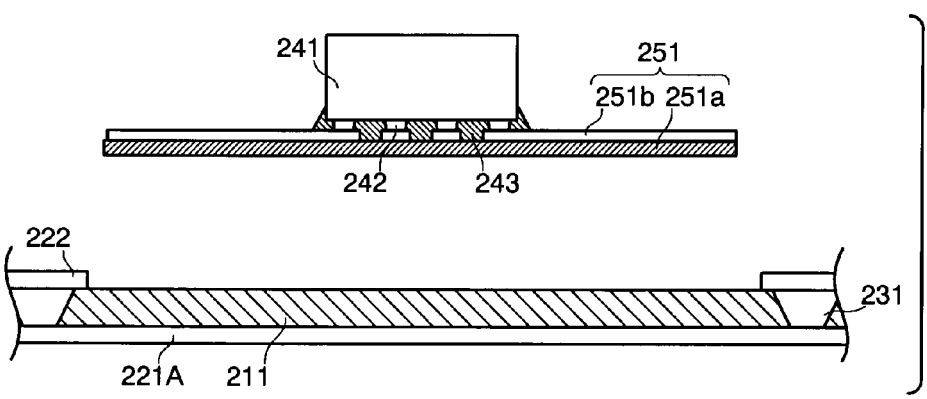

COMPONENT BUILT-IN WIRING BOARD AND MANUFACTURING METHOD OF COMPONENT BUILT-IN WIRING BOARD

CROSS-REFERENCE TO RELATED APPLICATIONS

This application is a national phase application of International Application No. PCT/JP2008/069678, filed Oct. 29, 2008, and claims the priority of Japanese Application Nos. 2007-284754, filed Nov. 1, 2007, 2007-302883, filed Nov. 22, 2007, and 2007-322062, filed Dec. 13, 2007, the contents of all of which are incorporated herein by reference.

TECHNICAL FIELD

The present invention relates to a component built-in wiring board having components buried and mounted in an insulating plate, and particularly to a component built-in wiring board having plural kinds of components buried and mounted in mixture. The present invention also relates to a component built-in wiring board having components buried and mounted in an insulating plate, and particularly to a component built-in wiring board having semiconductor chips buried and mounted by flip connection. The present invention also relates to a component built-in wiring board having components buried and mounted in an insulating plate and a manufacturing method thereof, and particularly to a component built-in wiring board in which a component such as a semiconductor chip having terminals arranged at a narrow pitch is buried and mounted and a manufacturing method thereof.

BACKGROUND ART

An example of a component built-in wiring board in which plural kinds of components are buried and mounted in mixture is described in JP-A 2003-197849 (KOKAI). The wiring board disclosed in this reference has a semiconductor chip as a component to be buried in addition to the passive component such as a chip condenser (chip capacitor). By burying the semiconductor component such as a semiconductor chip, an added value as the component built-in wiring board increases markedly in comparison with a case having the passive component only.

In a case where semiconductor components are buried and mounted in the wiring board, the wiring board itself is not so thick even though it is a multilayer board in these years, and normally it is necessary to use one, for example, a bare chip which is as thin as possible. When the bare chip is used, it is advantageous as described in the above reference under the constraint of the thickness to mount it with face down on the inner-layer wiring pattern of the wiring board. The technology to mount the semiconductor chip with face down on the wiring pattern is generally known as the flip-chip connection and can be incorporated.

The flip-chip connection includes the technology of aligning the connection pads having a fine pitch formed on the semiconductor chip with the lands of the wiring pattern, and the size of the work having the wiring pattern cannot be increased considerably to ensure the positional accuracy. Meanwhile, the technology of mounting the passive components such as chip capacitors on the wiring pattern is a so-called surface mounting technology using a solder or a conductive adhesive agent as the connecting member between the components and the wiring pattern. The alignment accuracy of the components to the wiring pattern in this case may be lower than that of the flip-chip connection. Therefore, production facilities for relatively large works can be used considering productivity.

Therefore, for the component built-in wiring board which has plural kinds of components such as passive components and semiconductor components buried and mounted in mixture in the wiring board, the surface mounting technology is used to mount the passive components, and the flip-chip connection technology is used to mount the semiconductor chips. Since separate processes are required, there is caused an issue to improve the productivity. The flip-chip connection is also disadvantageous in improving the productivity because it cannot conform to a large work.

Also, an example of a component built-in wiring board that a semiconductor chip is buried and mounted by the flip connection is described in the following JP-A 2003-197849 (KOKAI). By the flip connection of the semiconductor chip (bare chip), the thickness produced by mounting is saved to almost the minimum, and thus the flip connection becomes an important method when the semiconductor element is built in the wiring board.

For example, the flip connection can be made by further forming Au bumps on the terminal pads formed on the semiconductor chip and press-contacting them to a wiring pattern formed on the wiring board with an adhesive agent (underfill resin). What is considered here is to secure a low resistance connection between the Au bumps and the wiring pattern and its connection reliability. Therefore, the wiring pattern surface is required to have high cleanness, and as a commonly-performed method, the Au layer is formed by plating also on the surface of the wiring pattern.

Generally, to perform the flip connection of the semiconductor chip on the main surface of the wiring board, a protective layer such as a solder resist is formed on the wiring pattern excluding the portion which is used for connection, and then the Au plated layer is formed on the portion used for connection. Thus, Au plating which is not necessarily inexpensive can be applied to only a minimum area.

In a case where the semiconductor chip is buried in the wiring board and flip-connected, there are some differences from the flip connection of the semiconductor chip to the main surface described above. First, there is an influence that the solder resist becomes part of the insulating layer which is an inner layer. Generally, adhesiveness between the solder resist and the insulating plate material used for the wiring board is not as strong as that between the insulating plate materials. Therefore, when a configuration that the solder resist as the inner layer is omitted is adopted, it is necessary to apply a large area of Au plating, thus affecting the manufacturing cost. Adhesion between the Au plated layer and the insulating plate material is not necessarily strong, remaining an issue to be solved.

Moreover, an example of a component built-in wiring board having a semiconductor chip buried and mounted is described in the following JP-A 2003-197849 (KOKAI). As described in this reference, its built-in structure can be made simpler by directly burying and mounting the semiconductor chip (bare chip) in the wiring board.

However, it is impressive in recent years that the semiconductor chip is being made to have multiple terminals and a narrow pitch, and when such a state-of-the-art semiconductor chip is intended to be directly buried and mounted in a multilayer wiring board, there occurs a situation in which a general wiring rule of a buildup substrate cannot be used. For example, there is a case that the semiconductor chip has a terminal pitch of 50 µm or below, and a patterning method of a general buildup substrate is limited to a pitch of about 70 µm even by the latest technology.

Also, even though the wiring rule of the wiring board becomes conformable, the size of a work that a mounting apparatus can deal with is limited. To manufacture the printed wiring board, it is preferable to increase the size of one work as large as possible for improvement of working efficiency. Thus, multiple products are arranged in one work and manufactured at the same time. For example, the work size is 400 mm×500 mm. But, when the work is large, precision indexes for dimensional accuracy, positional accuracy and pattern finishing accuracy of the substrate become worse. Therefore, the mounting apparatus necessarily becomes to be limited for a small work size as the wiring rule of the wiring board becomes narrower. Thus, manufacturing efficiency becomes worse.

In addition, when the semiconductor chip is directly buried and mounted in the wiring board, the semiconductor chip cannot be screened solely, and the screening is performed in a process after the component built-in wiring board is formed. Thus, the manufacturing process for the wiring board is often wasted because of a defect in the semiconductor chip, causing a cost management issue.

Patent Reference 1: JP-A 2003-197849 (KOKAI)

DISCLOSURE OF THE INVENTION

The present invention relates to a component built-in wiring board having components buried and mounted in an insulating plate and its objective is to provide a component built-in wiring board capable of realizing high productivity and low cost even when plural kinds of components are buried and mounted in mixture. The present invention also relates to a component built-in wiring board having a semiconductor chip buried and mounted in an insulating plate by flip connection and its objective is to provide a component built-in wiring board which can be manufactured at a low cost while maintaining reliability of flip connection and functionality as the wiring board, and its manufacturing method. The present invention has been made considering the above-described circumstances and its objective is to provide a component built-in wiring board in which a component such as a semiconductor chip having terminals arranged at a narrow pitch is buried and mounted and a manufacturing method thereof, thereby enabling to secure manufacturing efficiency and to avoid a manufacturing process of a wiring board from resulting in nothing due to defects in the built-in component.

A component built-in wiring board according to one aspect of the invention includes a first insulating layer; a second insulating layer positioned in a laminated state on the first insulating layer; a semiconductor element buried in the second insulating layer, having a semiconductor chip with terminal pads and having surface mounting terminals arrayed in a grid shape connected electrically with the terminal pads; an electric/electronic component further buried in the second insulating layer; a wiring pattern sandwiched between the first insulating layer and the second insulating layer, including a first mounting land for the semiconductor element and a second mounting land for the electric/electronic component; a first connecting member connecting electrically the surface mounting terminal of the semiconductor element with the first mounting land; and a second connecting member connecting electrically the terminals of the electric/electronic component with the second mounting land, made of a same material as a material of the first connecting member.

That is, this component built-in wiring board has a semiconductor element as one of plural kinds of components and an electric/electronic component as another buried at the same time. Here, the semiconductor element has a semiconductor chip and a surface mounting terminal arranged in a grid pattern, and the semiconductor chip has a terminal pad. The terminal pad of the semiconductor chip and the surface mounting terminal are electrically connected. Therefore, the semiconductor element can be mounted on the wiring board by the surface mounting terminal arranged in a grid pattern.

Since the semiconductor element has the surface mounting terminal, surface mounting technology can be used to mount it on the wiring board in the same manner as the electric/electronic component. In addition, since the surface mounting terminal is particularly arranged in a grid pattern, namely in a plane arrangement, a plane area of the semiconductor element can be reduced as much as possible, and easiness of areal building in is secured similarly to a semiconductor chip. Therefore, even when plural kinds of components are buried and mounted in mixture, a component built-in wiring board having realized high productivity and low cost is provided.

A component built-in wiring board according to another aspect of the invention includes a first insulating layer; a second insulating layer positioned in a laminated state on the first insulating layer; a semiconductor chip buried in the second insulating layer, having terminal pads; a wiring pattern sandwiched between the first insulating layer and the second insulating layer, including a mounting land for the semiconductor chip and having a roughened surface on a side of the second insulating layer; a conductive bump sandwiched between the terminal pads of the semiconductor chip and the mounting land of the wiring pattern, electrically and mechanically connecting the terminal pads with the mounting land; and a resin disposed between the semiconductor chip and both the first insulating layer and the wiring pattern.

Namely, in order to make the semiconductor chip buried and mounted finely in the wiring board via the conductive bumps on the terminal pads by flip connection, the wiring pattern including the land in the wiring board has its surface roughened. According to an experiment, the electrical connection between the surface-roughened wiring pattern and the conductive bumps is realized to have significant improvement in a low resistance connection and the connection reliability in comparison with the case that the wiring pattern is not roughened. The adhesion between the surface-roughened wiring pattern and the insulating layer is good, and no adverse effect is caused on the functionality as the wiring board.

A manufacturing method of a component built-in wiring board according to still another aspect of the invention, includes patterning a metallic foil laminated on a first insulating plate to form a wiring pattern including lands to mount a semiconductor chip; roughening a surface of the wiring pattern including the lands; flip connecting a semiconductor chip having terminal pads and conductive bumps formed on the terminal pads with positions of the conductive bumps aligned with positions of the lands of the wiring pattern roughened; and integrating a second insulating plate different from the first insulating plate in a laminated state on the first insulating plate to bury the flip-connected semiconductor chip into the second insulating plate.

This manufacturing method is an example of manufacturing the above-described component built-in wiring board.

A component built-in wiring board, according to still another (fourth) aspect of the invention includes an intermediate board having an insulating plate and a wiring pattern formed on the insulating plate; a semiconductor chip mounted on the intermediate board via the wiring pattern; and a multilayer wiring board having an insulating layer in which the intermediate board and the semiconductor chip are buried, and having an inner wiring layer formed within the insulating layer to electrically conduct to the wiring pattern.

Namely, this component built-in wiring board has the semiconductor chip mounted on the intermediate board and buried together with the intermediate board in the insulating layer. The wiring pattern formed on the intermediate board is electrically conducting with the inner wiring layer of the multilayer wiring board. By configuring in this way, as for the built-in of the component when the wiring rule of the intermediate board corresponds with the wiring rule of the multilayer wiring board the configuration is appropriate, and even the components with narrow pitch terminals can be easily built in. In other words, the manufacturing efficiency can be secured by using a large work size as the wiring board. In addition, for the inspection of defective components, a stage that the components are mounted on the intermediate board can be used. Thus, it is possible to avoid the manufacturing process of the wiring board from coming to nothing due to a defect of the built-in component.

A manufacturing method of a component built-in wiring board according to still another (fifth) aspect of the invention includes preparing an intermediate mounted board which has an intermediate board having a first insulating plate and a first wiring pattern formed on the first insulating plate, and has a semiconductor chip mounted on the intermediate board via the first wiring pattern; and putting the intermediate mounted board on a second insulating plate different from the first insulating plate and integrating a third insulating plate different from the first and second insulating plates in a laminated state on the second insulating plate to bury the intermediate mounted board in the third insulating plate, and to electrically conduct the first wiring pattern to a second wiring pattern formed within the second or third insulating plate.

This manufacturing method is one example of manufacturing the above-described component built-in wiring board.

BRIEF DESCRIPTION OF THE DRAWINGS

FIG. 12A and FIG. 12B are tables showing results of functional evaluation in actually produced samples of the component built-in wiring board shown in FIG. 1.

FIG. 13 is a table showing particular results, in the evaluation shown in FIG. 12A and FIG. 12B, of differences in a defect occurrence frequency due to differences in surface roughness after roughening.

FIG. 16A, FIG. 16B, FIG. 16C, FIG. 16D and FIG. 16E are process charts schematically showing in a sectional view part of the production process of the component built-in wiring board shown in FIG. 14.

EXPLANATION OF NUMERALS

Figure 1:
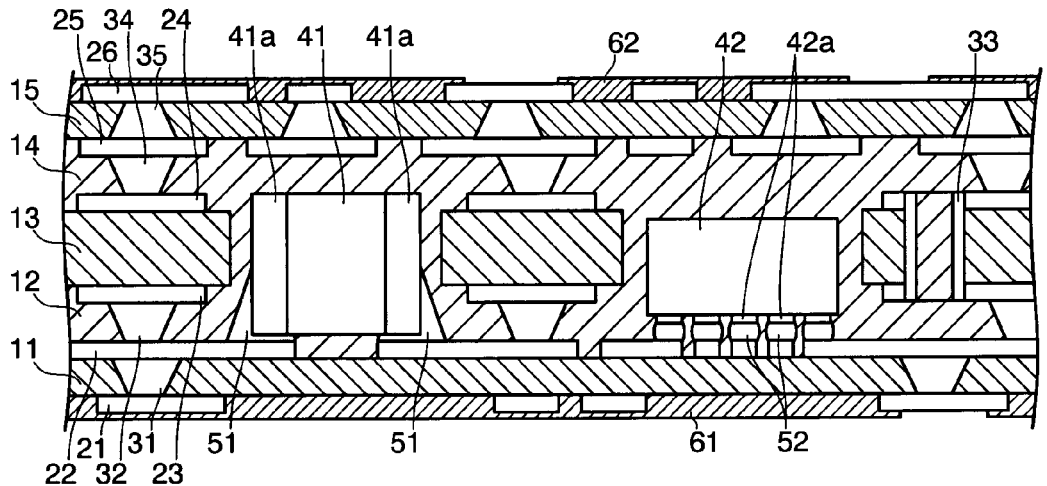
FIG. 1 is a sectional view schematically showing a structure of the component built-in wiring board according to an embodiment of the invention.

1 . . . wiring board material, 2 . . . wiring board material, 3 . . . wiring board material, 11 . . . insulating layer, 11A . . . prepreg, 12 . . . insulating layer, 12A . . . prepreg, 13 . . .

insulating layer, 13A . . . prepreg, 14 . . . insulating layer, 14A . . . prepreg, 15 . . . insulating layer, 21 . . . wiring layer (wiring pattern), 21A . . . metallic foil (copper foil), 22 . . . wiring layer (wiring pattern), 22A . . . metallic foil (copper foil), 23 . . . wiring layer (wiring pattern), 23A . . . metallic foil (copper foil), 24 . . . wiring layer (wiring pattern), 24A . . . metallic foil (copper foil), 25 . . . wiring layer (wiring pattern), 26 . . . wiring layer (wiring pattern), 26A . . . metallic foil (copper foil), 31, 32, 34, 35 . . . interlayer connector (conductive bump by conductive composition printing), 33 . . . through hole conductor, 41 . . . chip component (electric/electronic component), 41a . . . terminal, 42 . . . semiconductor element (by wafer-level chip-scale package), 42a . . . surface mounting terminal, 42b . . . rewiring layer, 42c . . . terminal pad, 42d, 42e . . . insulating layer, 42w . . . semiconductor wafer, 51, 52 . . . connecting member (solder or conductive composition), 51A, 51B . . . cream solder or conductive composition before curing, 61, 62 . . . solder resist, 71, 72 . . . open portion, 81, 82 . . . open portion for a component, 83 . . . through hole, 101 . . . wiring board material, 102 . . . wiring board material, 103 . . . wiring board material, 111 . . . insulating layer, 111A . . . prepreg, 112 . . . insulating layer, 112A . . . prepreg, 113 . . . insulating layer, 113A . . . prepreg, 114 . . . insulating layer, 114A . . . prepreg, 115 . . . insulating layer, 121 . . . wiring layer (wiring pattern), 121A . . . metallic foil (copper foil), 122 . . . wiring layer (wiring pattern), 122a . . . roughened surface, 122A . . . metallic foil (copper foil), 123 . . . wiring layer (wiring pattern), 123A . . . metallic foil (copper foil), 124 . . . wiring layer (wiring pattern), 124A . . . metallic foil (copper foil), 125 . . . wiring layer (wiring pattern), 126 . . . wiring layer (wiring pattern), 126A . . . metallic foil (copper foil), 131, 132, 134, 135 . . . interlayer connector (conductive bump by conductive composition printing), 133 . . . through hole conductor, 141 . . . semiconductor chip, 142 . . . conductive bump (Au stud bump), 151 . . . underfill resin, 151A . . . underfill resin (before curing), 161, 162 . . . solder resist, 171 . . . open portion for a component, 172 . . . through hole, 201, 201A . . . wiring board material, 202, 202A, 202B, 202C . . . wiring board material, 203 . . . wiring board material, 211 . . . insulating layer, 211A . . . prepreg, 212 . . . insulating layer, 212A . . . prepreg, 213 . . . insulating layer, 214 . . . insulating layer, 214A . . . prepreg, 215 . . . insulating layer, 221 . . . wiring layer, 221A . . . metallic foil (copper foil), 222 . . . inner wiring layer, 222A . . . metallic foil (copper foil), 223 . . . inner wiring layer, 223A . . . metallic foil (copper foil), 224 . . . inner wiring layer, 224A . . . metallic foil (copper foil), 225 . . . inner wiring layer, 226 . . . wiring layer, 226A . . . metallic foil (copper foil), 231, 232, 232A, 234, 235 . . . interlayer connector (conductive bump by conductive composition printing), 232a, 232aA, . . . interlayer connector (conductive bump by conductive composition printing), 233 . . . through hole conductor, 241 . . . semiconductor chip, 242 . . . conductive bump (Au stud bump), 243 . . . underfill resin, 243A . . . underfill resin (before curing), 251, 251A, 251B . . . intermediate board (carrier board), 251a, 251aA . . . insulating plate, 251b . . . wiring pattern, 251c . . . rear surface wiring pattern, 251d . . . interlayer connector, 252 . . . anisotropic conductive film, 261, 262 . . . solder resist, 271 . . . open portion for a component, 272 . . . through hole.

Embodiments

As a mode of an embodiment according to an aspect of the present invention, the second insulating layer may be a laminated layer of at least two insulating layers, and the component built-in wiring board may further include a second wiring pattern sandwiched between the at least two insulating layers; and an interlayer connector sandwiched between a surface of the wiring pattern and a surface of the second wiring pattern to penetrate partly through the second insulating layer in a layered direction, made of a conductive composition and having a shape with an axis corresponding to the layered direction and a diameter varying in an axial direction. This interlayer connector is an example of an interlayer connector, which is formed in the layered direction to penetrate partly through the second insulating layer in which the electric/electronic component and semiconductor elements are buried, and for example it is an interlayer connector resulting from a conductive bump formed by screen printing of the conductive composition.

As a mode of the embodiment, the first connecting member and the second connecting member may be solders mainly consisting of tin. Thereby, as a manufacturing process, the semiconductor element and the electric/electronic component can be simultaneously built in and mounted in the wiring board by reflowing the solder. A lead-free solder can also be used.

As a mode of the embodiment, the first connecting member and the second connecting member may be solders having a microstructure resulting from copper particles and mainly consisting of tin. Thereby, even when the solder for built-in components remelts because of heat at the time of mounting the components on the main surface of the wiring board, the occurrence of a defect such as a defective connection can be prevented effectively.

As a mode of the embodiment, the first connecting member and the second connecting member may be conductive compositions. Thereby, it becomes easy for the connecting members to secure heat resistance. As a result, the occurrence of a defective connection in the connection portion of the built-in component because of heat at the time of mounting the component on the main surface of the wiring board can be prevented effectively.

As a mode of the embodiment, the electrical connection between the surface mounting terminal of the semiconductor element and the terminal pads may be made by a rewiring layer formed on the semiconductor chip. When such a rewiring layer is used, a package-corresponding portion in the semiconductor element can be made to have a small thickness and volume so as to be more suitable for being built in the wiring board.

As a mode of the embodiment, semiconductor element may have a thickness smaller than a height of the electric/electronic component. Thereby, as a manufacturing process, since the force in the layered direction applied to the semiconductor element at the time of lamination is suppressed by the electric/electronic component, a defect that the semiconductor element is broken during manufacturing can be prevented effectively.

As a mode of the embodiment, the surface mounting terminal of the semiconductor element may be an LGA terminal. In the surface mounting using the LGA, mounting on the wiring board can be made without using bumps such as solder balls, and the size in a height direction can be suppressed, so that it is more suitably built in.

As a mode of the embodiment, the surface mounting terminal of the semiconductor element may have a Ni/Au plated layer as a surface layer. When the surface mounting terminal has such a plated layer on the surface layer, good soldering and its high connection reliability can be obtained.

As a mode of the embodiment, the surface mounting terminal of the semiconductor element may have a tin plated layer as a surface layer. It is more inexpensive, and good soldering and its high connection reliability can be obtained.

As a mode of the embodiment, the surface mounting terminal of the semiconductor element may have Cu as a surface layer. Even Cu can be soldered. This case has a high possibility that the structure of the semiconductor element can be made simpler, and manufacturing can be made more inexpensively.

As a mode of an embodiment according to another aspect of the invention, the second insulating layer may be a laminated layer of at least two insulating layers, and the component built-in wiring board may further include a second wiring pattern sandwiched between the at least two insulating layers; and an interlayer connector sandwiched between a surface of the wiring pattern and a surface of the second wiring pattern to penetrate partly through the second insulating layer in a layered direction, made of a conductive composition, and having a shape with an axis corresponding to the layered direction and a diameter varying in an axial direction.

This interlayer connector is an example of the interlayer connector which is formed in the layered direction to penetrate partly through the second insulating layer in which the semiconductor chip is buried, and results from a conductive bump formed by, for example, screen printing of the conductive composition. This interlayer connector is sandwiched between the second wiring pattern and the wiring pattern. Since the wiring pattern surface is roughened, the connection reliability between the wiring pattern and the interlayer connector is also improved to be referable.

As a mode of the embodiment, the wiring pattern may have Cu as a material thereof, and the conductive bump may have Au as a material thereof. As the wiring pattern, Cu is most common and inexpensive, and when the conductive bumps are Au, their connection compatibility with Cu is good and preferable.

Here, the surface of the wiring pattern may have a surface roughness of exceeding 0.45 μm when evaluated by a ten-point surface roughness Rz. According to an experiment, when the surface roughness of the wiring pattern exceeds 0.45 μm, the occurrence of samples which are judged defective in conduction with the conductive bumps by an initial continuity test is eliminated.

As a mode of an embodiment of the manufacturing method according to still another aspect of the invention, the second insulating plate may be a laminated layer of at least two insulating layers and may have a second wiring pattern, which is sandwiched between the at least two insulating layers, and an interlayer connector, which is contacted with a surface of the second wiring pattern, is penetrated partly through the second insulating plate in a layered direction to have a head exposed, is made from a conductive composition and has a shape with an axis corresponding to the layered direction and a diameter varying in an axial direction; and the integrating the second insulating plate in the laminated state on the first insulating plate is performed to contact the head of the interlayer connector of the second insulating plate to the roughened wiring pattern.

Here, the interlayer connector is an example of the interlayer connector which is formed in the layered direction to penetrate partly through the second insulating layer in which the semiconductor chip is buried, and results from a conductive bump formed by, for example, screen printing of the conductive composition. This interlayer connector results in being sandwiched between the second wiring pattern and the wiring pattern, and thereby since the wiring pattern surface is roughened, the connection reliability between the wiring pattern and the interlayer connector is also improved to be preferable.

As a mode of the embodiment, the metallic foil may have Cu as a material thereof, and the conductive bumps may have Au as a material thereof. As the wiring pattern, Cu is most common and inexpensive, and when the conductive bumps are Au, their connection compatibility with Cu is good and preferable.

Here, the roughening may be performed so as to make a surface roughness be a roughness exceeding 0.45 μm when evaluated by a ten-point surface roughness Rz. According to an experiment, when the surface roughness of the wiring pattern exceeds 0.45 μm, the occurrence of samples which are judged defective in conduction with the conductive bumps by an initial continuity test is eliminated.

Here, the roughening may be performed by a blackening-and-reducing process of Cu. Alternatively, the roughening may be performed by micro-etching of Cu. Such roughening methods are examples of the generally adoptable roughening method.

As a mode of an embodiment according to still another (fourth) aspect of the invention, the electrical conduction between the wiring pattern of the intermediate board and the inner wiring layer of the multilayer wiring board may be made via a interlayer connector which is disposed in the thickness direction to penetrate partly through the insulating layer of the multilayer wiring board so as to be sandwiched between the wiring pattern and the inner wiring layer. It is a mode using, for example, the interlayer connector used in the multilayer wiring board also for electrical conduction with the wiring pattern of the intermediate board and contributes to the cost reduction because the manufacturing process does not require a new step for the electrical conduction.

Here, the interlayer connector may be in contact with a surface of the wiring pattern which is a same side as a surface of the wiring pattern where the semiconductor chip is mounted, to be sandwiched between the inner wiring layer and the wiring pattern. This is a mode in which the front side of the wiring pattern is served to the electrical conduction with the inner wiring layer.

Alternatively, the interlayer connector may be in contact with a surface of the wiring pattern which is a side opposite to a surface of the wiring pattern where the semiconductor chip is mounted, to be sandwiched between the inner wiring layer and the wiring pattern. This is a mode in which the rear side of the wiring pattern is served to the electrical conduction with the inner wiring layer.

Further, the wiring pattern of the intermediate board may be formed on one side and another side of the insulating plate to electrically conduct to each other; the semiconductor chip may be mounted on the intermediate board via the wiring pattern on the one side of the insulating plate; and the interlayer connector may be in contact with the wiring pattern on the other side of the insulating plate to be sandwiched between the inner wiring layer and the wiring pattern on the other side. It is a mode in which the wiring pattern is formed on both surfaces of the insulating plate of the intermediate board, the semiconductor chip is mounted on the wiring pattern on one of the surfaces, and the wiring pattern on the other surface is served for the electrical conduction with the inner wiring layer.

Here, the multilayer wiring board may have a vertical conductor having a same composition as a composition of the interlayer connector. This is a mode in which the interlayer connector used for the multilayer wiring board is also used for the electrical conduction with the wiring pattern of the intermediate board, and the manufacturing process does not need a new process for this electrical conduction, thereby contributing to cost reduction.

As a mode of the embodiment, the electrical conduction between the wiring pattern of the intermediate board and the inner wiring layer of the multilayer wiring board may be made by a solder or an anisotropic conductive material disposed between the wiring pattern and the inner wiring layer. Thereby, though a process of aligning the wiring pattern of the intermediate board and the inner wiring layer is newly required, since the pattern and the layer are mutually aligned, it becomes possible to connect finer patterns mutually, and their connection is made securely.

As a mode of the embodiment, the semiconductor chip may be flip-connected to the intermediate board. The flip connection can suppress the size in a height direction, so that it is convenient for being incorporated into the wiring board. Alternatively, even when the semiconductor chip is mounted on the intermediate board by wire bonding, it is also possible to be built in.

As a mode of the embodiment, the insulating plate of the intermediate board may have a thickness smaller than a thickness of any of multiple-layered insulating layers configuring the multilayer wiring board. Thereby, an influence of having the intermediate board built in remains in only a fewer of the plural insulating layers of the multilayer wiring board, and the freedom of pattern forming in the inner wiring layer is not decreased considerably.

As a mode of the embodiment, the insulating plate of the intermediate board may be a flexible material. As a typical example of the intermediate board having the insulating plate of the flexible material, a TCP (tape carrier package) structure is usable, and thereby more inexpensive manufacturing can be expected according to the many past records.

As a mode of an embodiment of the manufacturing method according to still another (fifth) aspect of the invention, the integrating the third insulating plate in the laminated state on the second insulating plate may be performed so as to make the electrical conduction between the first wiring pattern and the second wiring pattern via an interlayer connector formed in the thickness direction to penetrate partly through the second or third insulating plate. This is a mode of using, for example, the interlayer connector used in the multilayer wiring board also for the electrical conduction with the wiring pattern of the intermediate board, and the manufacturing process does not require a new process for this electrical conduction, thereby contributing to cost reduction.

As a mode of the embodiment, the electrical conduction between the first wiring pattern and the second wiring pattern may be obtained by providing a solder or an anisotropic conductive film between the first wiring pattern and the second wiring pattern. Thereby, though a process of aligning the first wiring pattern and the second wiring pattern is newly required, their connection is made securely.

Based on the above, the embodiments of the present invention are described below in detail with reference to the drawings. FIG. 1 is a sectional view schematically showing a structure of the component built-in wiring board according to an embodiment of the invention. As shown in FIG. 1, this component built-in wiring board has an insulating layer 11 (first insulating layer), insulating layers 12, 13, 14 and 15 (12, 13, 14 and 15 belong to second insulating layer), a wiring layer (wiring pattern) 21, wiring layer 22, wiring layer 23 (second wiring pattern), wiring layers 24, 25 and 26 (=6 layers in total), interlayer connectors 31, 32, 34 and 35, a through hole conductor 33, a chip component 41 (electric/electronic component), a semiconductor element (based on the wafer-level chip-scale package) 42, connecting members (solders) 51 and 52, and solder resists 61 and 62.

Namely, this wiring board has the chip component 41 and the semiconductor element 42, which are mutually different kinds of components, as built-in components. The chip component 41 is a so-called surface mounting chip component and, for example, a chip capacitor here. Its plane size is, for example, 0.6 mm×0.3 mm. It has a terminal 41a on its both sides, and its bottom is positioned to face a mounting land of the wiring layer 22. The terminal 41a of the chip component 41 and the mounting land are electrically and mechanically connected by the connecting member 51.

The semiconductor element 42 is an element having the wafer-level chip-scale package and provided with at least a semiconductor chip and surface mounting terminals 42a formed on the semiconductor chip and arrayed in a grid shape. Its structural example and manufacturing process example are described in detail later (FIG. 2 and FIG. 3). The surface mounting terminals 42a are, while electrically conducting from the terminal pads which are originally possessed by the semiconductor chip via a rewiring layer, terminals brought by relocating positions of the terminal pads using the rewiring layer. The arrangement density of the terminals by the relocation becomes rough in comparison with that of the terminal pads on the semiconductor chip. Thereby, the semiconductor element 42 can be mounted on the mounting land of the wiring layer 22 via the connecting member (solder) 52 by surface mounting technology similar to that applied to the chip component 41.

Another structure of the component built-in wiring board is described. The wiring layers 21 and 26 are wiring layers on both main surfaces of the wiring board, and various kinds of components (not shown) can be mounted thereon. Excepting the land portions of the wiring layers 21 and 26 on which solder (not shown) should be placed by mounting, formed are the solder resists 61 and 62 (their thickness is, for example, about 20 μm) which hold the solder melted at the time of solder connection on the land portions of both main surfaces and then function as the protective layer. A Ni/Au plated layer (not shown) having high corrosion resistance may be formed on the surface layer of the land portions.

The wiring layers 22, 23, 24 and 25 are wiring layers which are inner layers. The insulating layer 11 is positioned between the wiring layer 21 and the wiring layer 22, the insulating layer 12 is positioned between the wiring layer 22 and the wiring layer 23, the insulating layer 13 is positioned between the wiring layer 23 and the wiring layer 24, the insulating layer 14 is positioned between the wiring layer 24 and the wiring layer 25, and the insulating layer 15 is positioned between the wiring layer 25 and the wiring layer 26, thereby separating the wiring layers 21 to 26. The individual wiring layers 21 to 26 are made of, for example, a metallic (copper) foil having a thickness of 18 μm.

The individual insulating layers 11 to 15 excepting the insulating layer 13 have a thickness of, for example, 100 μm, the insulating layer 13 has a thickness of, for example, 300 μm, and they are rigid materials made of, for example, a glass epoxy resin. Particularly, the insulating layer 13 has open portions at positions corresponding to the embedded chip component 41 and semiconductor element 42 to provide spaces for burying the chip component 41 and the semiconductor element 42. The insulating layers 12 and 14 deform and penetrate to fill the above open portions of the insulating layer 13 for the embedded chip component 41 and semiconductor element 42 and the space within the through hole conductor 33 of the insulating layer 13, and there is not a space therein which becomes a void.

The wiring layer 21 and the wiring layer 22 can be electrically conducted by the interlayer connector 31 which is sandwiched between their pattern surfaces and formed to penetrate through the insulating layer 11. Similarly, the wiring layer 22 and the wiring layer 23 can be electrically conducted by the interlayer connector 32 which is sandwiched between their pattern surfaces and formed to penetrate through the insulating layer 12. The wiring layer 23 and the wiring layer 24 can be electrically conducted by the through hole conductor 33 formed to penetrate through the insulating layer 13. The wiring layer 24 and the wiring layer 25 can be electrically conducted by the interlayer connector 34 which is sandwiched between their pattern surfaces and formed to penetrate through the insulating layer 14. The wiring layer 25 and the wiring layer 26 can be electrically conducted by the interlayer connector 35 which is sandwiched between their pattern surfaces and formed to penetrate through the insulating layer 15.

The interlayer connectors 31, 32, 34 and 35 are resulting from conductive bumps which are formed by screen printing of a conductive composition, and their diameters are varied in the axial direction (the vertical layered direction in FIG. 1) according to the manufacturing process. Their diameters are, for example, 200 μm on the larger side.

Figure 2A:
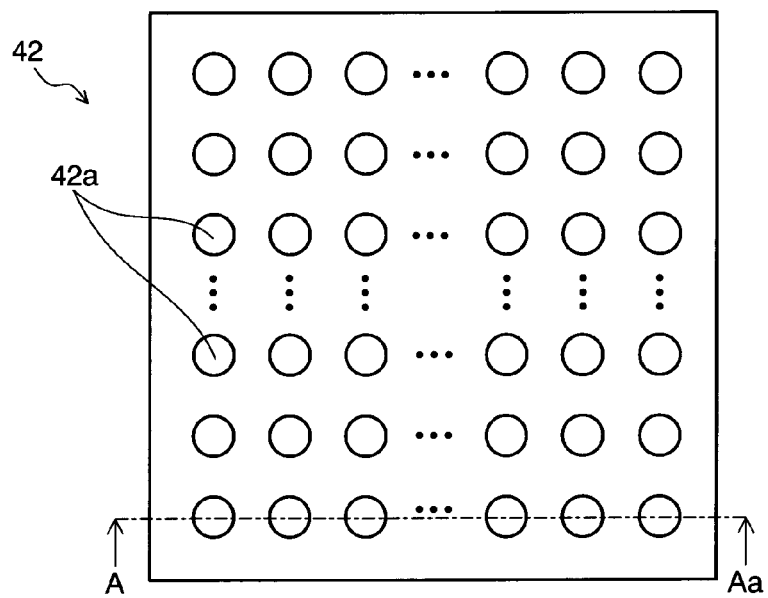
FIG. 2A and FIG. 2B are a bottom view and a sectional view schematically showing in more detail a semiconductor element 42 used in the component built-in wiring board shown in FIG. 1.
Figure 2B:
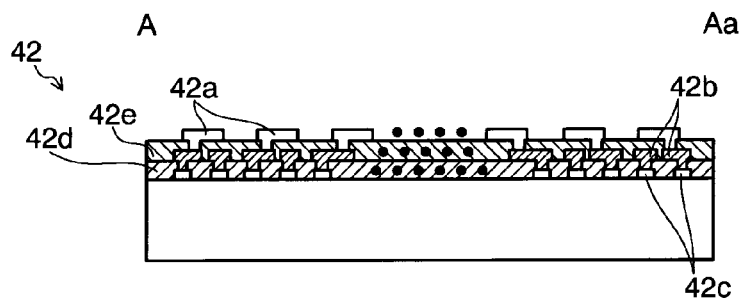

The structure of the component built-in wiring board according to the embodiment was wholly described above. A structure of the semiconductor element 42 used for the component built-in wiring board is described below in more detail with reference to FIG. 2A and FIG. 2B. FIG. 2A and FIG. 2B are a bottom view and a sectional view schematically showing in more detail the semiconductor element 42 used for the component built-in wiring board shown in FIG. 1. A section taken in the direction indicated by arrows at an A-Aa position in FIG. 2A is FIG. 2B. In FIG. 2A and FIG. 2B, like constituents corresponding to those shown in FIG. 1 are denoted by like reference numerals.

As shown in FIG. 2A, the semiconductor element 42 has the surface mounting terminals 42a arranged in a grid pattern. The terminals 42a are arranged with a pitch of, for example, 0.2 mm through 1.0 mm. When the number of terminals required as the semiconductor element 42 is few, likely is a mode in which the terminals 42a is not arranged near the center of the surface on which the terminals 42a are arranged.

This semiconductor element 42 is in a form of so-called LGA (land grid array) which does not have a solder ball on the terminals 42a as a form before mounting for incorporating in the wiring board. The mounting size in a height direction is reduced by configuring without a solder ball, and suitability for building in is improved more. If the thickness of the wiring board for building in allows, a so-called BGA (ball grid array) in which the solder balls are mounted on the terminals 42a can also be used.

In the sectional direction of the semiconductor element 42, the surface mounting terminals 42a are formed on an insulating layer 42e and in contact with a rewiring layer 42b via portions formed to penetrate through an insulating layer 42e as shown in FIG. 2B. The rewiring layer 42b is formed on an insulating layer 42d, which is formed between the insulating layer 42e and the semiconductor chip, and in contact with terminal pads 42c on the semiconductor chip via portions formed to penetrate through the insulating layer 42d.

Since the terminal pads 42c are generally arranged in a line along each side of the semiconductor chip, their arrangement pitch is relatively narrow. Namely, the rewiring layer 42b is disposed to mediate the connection between the arrangement pitch of the terminal pads 42c and the arrangement pitch of the surface mounting terminals 42a which are arranged in a grid pattern to have a relatively large arrangement pitch. By configuring as described above, despite this semiconductor element 42 has a surface mountable form it has the same plane area as that of the semiconductor chip, and a size in the thickness direction is slightly larger than that of the semiconductor chip itself. To make the semiconductor element 42 thinner, in advance the rear surface of the semiconductor chip may be ground by a grinding process which is additionally provided. For example, the total thickness can be about 0.3 mm or below.

An example of the manufacturing process of the semiconductor element 42 is described below with reference to FIG. 3A through FIG. 3G. FIG. 3A through FIG. 3G are process charts schematically showing in a sectional view an example of the production process of the semiconductor element 42 used in the component built-in wiring board shown in FIG. 1. In FIG. 3A through FIG. 3G, like constituents corresponding to those shown in the drawing described above are denoted by like reference numerals.

Figure 3A:
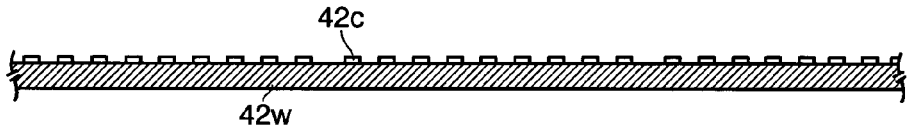
FIG. 3A, FIG. 3B, FIG. 3C, FIG. 3D, FIG. 3E, FIG. 3F and FIG. 3G are process charts schematically showing in a sectional view an example of the production process of the semiconductor element 42 used in the component built-in wiring board shown in FIG. 1.

As shown in FIG. 3A, prepared is a semiconductor wafer 42w with plural semiconductor devices already having been formed on its surface. On the surface of the semiconductor wafer 42w, the terminal pads 42c are formed as external connection portions of the individual semiconductor devices. The terminal pads 42c have generally an area required for wire bonding and disposed along four sides of the individual semiconductor devices with an arrangement pitch at a level of not adversely affecting on the wire bonding. This arrangement pitch is narrower than that of the terminals for general surface mounting.

Figure 3B:
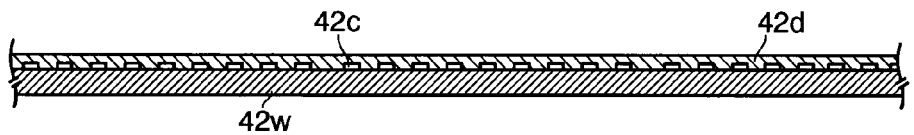

Following above, as shown in FIG. 3B, the insulating layer 42d is formed on the entire surface of the semiconductor wafer 42w to cover the pads 42c. A known method may be used to form it and, for example, polyimide is dripped as an insulating material and spin-coated to a thickness of, for example, about 1 μm on the semiconductor wafer 42w.

Figure 3C:
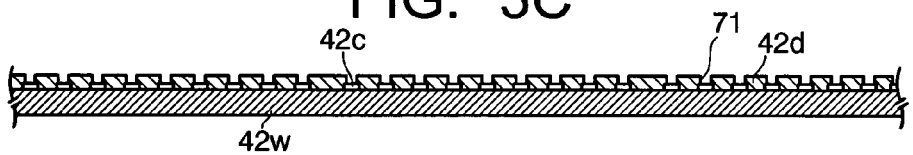

Following above, as shown in FIG. 3C, the insulating layer 42d on the pads 42c is selectively etched for removal to form open portions 71 in the insulating layer 42d to communicate with the pads 42c. For selective etching, a known method such as photolithography can be applied. Instead of the method shown in FIG. 3B and FIG. 3C, a method of selectively forming the insulating layer 42d excepting above the pads 42c may be used. Similarly, a known method can be used to form the insulating layer 42d selectively.

Figure 3D:
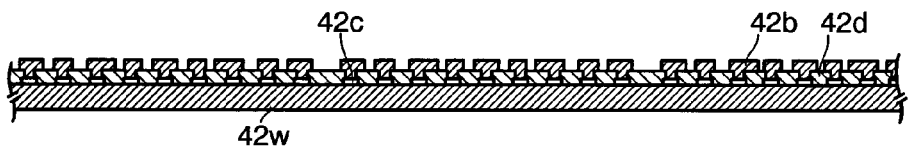

After the open portions 71 are formed, the rewiring layer 42b of a conductive material is formed on the insulating layer 42d to fill the open portions 71 and to have a necessary pattern as shown in FIG. 3D. For the rewiring layer 42b, a material such as Al, Au, or Cu can be used. As the forming method, an appropriate one can be selected from sputtering, evaporation, plating, and so forth, considering the material used. As the patterning method, considering the material used, adoptable are forming the conductive material to entirely cover the insulating layer 42d and removing unnecessary portions by etching, or forming a resist mask having a prescribed pattern on the insulating layer 42d and further forming a layer which becomes the rewiring layer 42b. The rewiring layer 42b may have a thickness of, for example, about 1 μm.

Figure 3E:
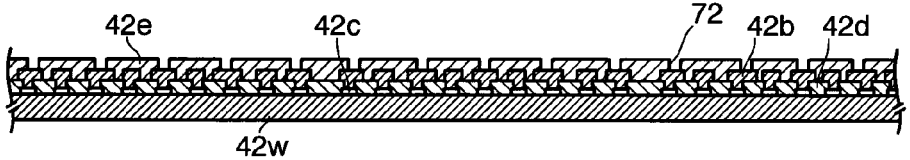

After the rewiring layer 42b is formed, the insulating layer 42e is formed to cover the rewiring layer 42b, and the insulating layer 42e is selectively removed by etching to form open portions 72 in the insulating layer 42e to communicate with the rewiring layer 42b as shown in FIG. 3E. The process shown in FIG. 3E can be performed by the same procedures as those in FIG. 3B and FIG. 3C which are the processes of forming and fabricating the insulating layer 42d. The same procedures can be also applied when the method of selective formation of the insulating layer 42e is selected.

Figure 3F:
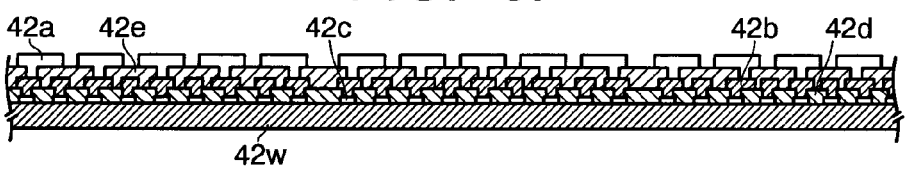

After the open portions 72 are formed, the surface mounting terminals 42a of a conductive material are formed to fill the open portions 72 and to occupy prescribed arrangement positions on the insulating layer 42e as shown in FIG. 3F. For the conductive material, for example, Al, Au or Cu can be used. As the forming method, an appropriate one can be selected from sputtering, deposition, plating, and so forth, considering the material used. Selective formation can be performed, considering the material used, by forming the conductive material to entirely cover the insulating layer 42e and removing unnecessary portions by etching, or by forming a resist mask having a prescribed pattern on the insulating layer 42d and further forming a layer which becomes the surface mounting terminals 42a. The layer of the surface mounting terminals 42a can be determined to have a thickness of, for example, about 1 μm.

The surface mounting terminals 42a, when a conductive material such as Cu or Al is used therefor, may be further treated to cover their surface layer by a Ni/Au plated layer or a Sn (tin) plated layer. To apply such plating, for example, a nonelectrolytic plating process can be used. When the plated layer of a prescribed material is formed, good soldering and its connection reliability can be obtained in the surface mounting for building in the wiring board.

Figure 3G:
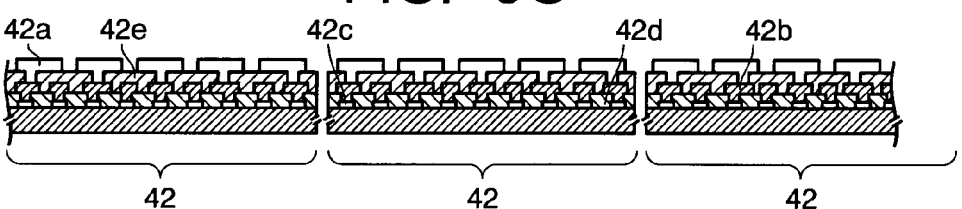

After the surface mounting terminals 42a are formed, the semiconductor wafer 42w is lastly diced to obtain the individual semiconductor elements 42 as shown in FIG. 3G. The semiconductor elements 42 thus obtained can be served, as described above, to the surface mounting process using the surface mounting terminals 42a in the same manner as the chip components.

In FIG. 3A through FIG. 3G, the method of forming the surface mounting terminals 42a using the wafer 42w not diced was described above, but it is an example of forming with productivity increased more, and naturally the same method can also be used to form the surface mounting terminals 42a on the individual semiconductor chips diced.

As a modified example of the semiconductor element 42 shown in FIG. 3G, there is an example of forming the rewiring layer 42b and the surface mounting terminals 42a as the same layer. In this case, a layer of a conductive material is formed on the insulating layer 42d to have a pattern necessary as rewiring and to have a pattern of the surface mounting terminals 42a in contact with the pattern. The layer of the conductive material fills the open portions 71 formed in the insulating layer 42d. Further, the insulating layer 42e is formed to cover all the surfaces excepting the portions of the surface mounting terminals 42a in the layer of the conductive material. Also in this case, the semiconductor element having the surface mounting terminals 42a with the terminal pads 42c of the semiconductor device relocated can be obtained.

As described above, the component built-in wiring board according to this embodiment has the semiconductor element 42 as one of plural kinds of components and the chip components 41 as another buried at the same time. Here, the semiconductor element 42 has the semiconductor chip and the surface mounting terminals 42a arranged in a grid pattern. Therefore, when the semiconductor element 42 is mounted for building in the wiring board, the same surface mounting technology as that for the chip components 41 can be applied at the same time. Thus, the surface mounting technology for mounting plural kinds of components at the same time can be used, and in the mounting a relatively large work can be used in view of productivity. Therefore, the component built-in wiring board with high productivity and low cost realized is obtained.

In addition, since the surface mounting terminals 42a are particularly arranged in a grid pattern, namely in a plane arrangement, a plane area of the semiconductor element 42 can be reduced as much as possible. Besides, since the electrical connection between the surface mounting terminals 42a and the terminal pads 42c on the semiconductor chip is made using the rewiring layer 42b formed on the semiconductor chip, the thickness as the semiconductor element 42 does not become so large compared with that of the semiconductor chip itself. Namely, the same easiness of building in as that of building in of the semiconductor chip is secured in terms of the area and thickness of the semiconductor element 42. Meanwhile, a high-accuracy aligning process for flip-chip connection required for building in the semiconductor chip is not required. This also contributes to improvement of productivity and cost reduction.

As the semiconductor element 42 to be built in or buried, another package product (for example, one having an interpose substrate between the semiconductor chip and the surface mounting element 42a) can be used instead of the above-described wafer-level chip-scale package. In this case, the element inevitably has an area and a thickness larger than those of the wafer-level chip-scale package, but it can be used depending on the specifications of the substrate used for building in of the components. In this case, the advantage that the same surface mounting technology as that for the chip component 41 can be simultaneously applied to the semiconductor element 42 is maintained.

The manufacturing process of the component built-in wiring board shown in FIG. 1 is described below with reference to FIG. 4A through FIG. 4F, FIG. 5A through FIG. 5E and FIG. 6. These drawings are process charts schematically showing in a sectional view part of the production process of the component built-in wiring board shown in FIG. 1. In these drawings, like or equivalent constituents corresponding to those shown in FIG. 1 are denoted by like reference numerals.

Figure 4A:
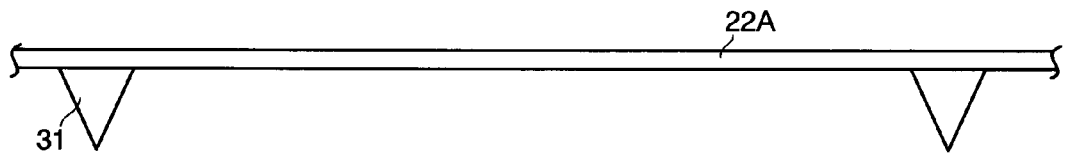
FIG. 4A, FIG. 4B, FIG. 4C, FIG. 4D, FIG. 4E and FIG. 4F are process charts schematically showing in a sectional view part of the production process of the component built-in wiring board shown in FIG. 1.

FIG. 4A through FIG. 4F are described first. FIG. 4A through FIG. 4F show a manufacturing process of a portion mainly including the insulating layer 11 among the individual constituents shown in FIG. 1. As shown in FIG. 4A, a paste-like conductive composition, which becomes the interlayer connector 31, is formed in a nearly conical bump shape (a bottom diameter of, for example, 200 μm, and a height of, for example, 160 μm) on a metallic foil (electrolytic copper foil) 22A having a thickness of, for example, 18 μm by, for example, screen printing. This conductive composition has metallic microscopic particles of silver, gold or copper or carbon microscopic particles dispersed into a paste-like resin. For convenience of explanation, printing is made on the bottom surface of the metallic foil 22A but may be made on the top surface (the same is also applied to the following drawings). After the interlayer connector 31 is printed, it is cured by drying.

Figure 4B:
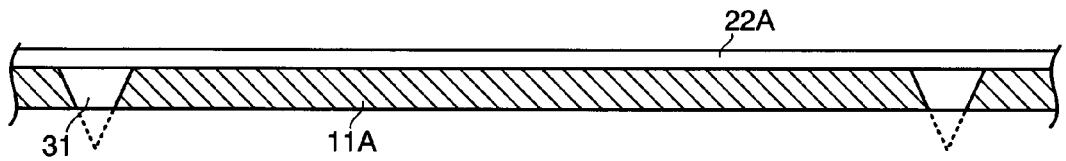
Figure 4C:
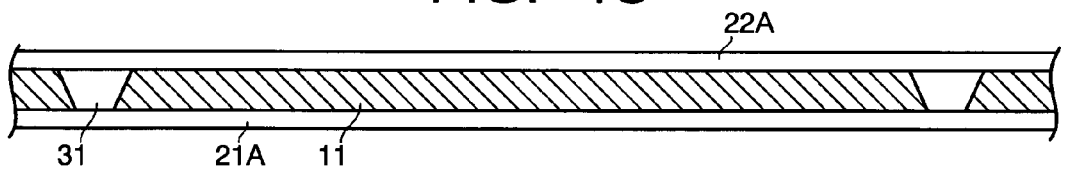

Following above, as shown in FIG. 4B, an FR-4 prepreg 11A having a nominal thickness of, for example, 100 μm is laminated on the metallic foil 22A to have the interlayer connectors 31 penetrated through it, so that their heads are exposed. At the time of exposure or after that, the tip ends may be crushed by plastic deformation (in any event, the interlayer connectors 31 have an axis corresponding to the layered direction with their diameter varied in the axial direction). Subsequently, a metallic foil (electrolytic copper foil) 21A is arranged by laminating on the prepreg 11A, and as shown in FIG. 4C they are integrated by pressing and heating. At this time, the metallic foil 21A falls in a state of being electrically conducting with the interlayer connectors 31, and the prepreg 11A cures completely to become the insulating layer 11.

Figure 4D:
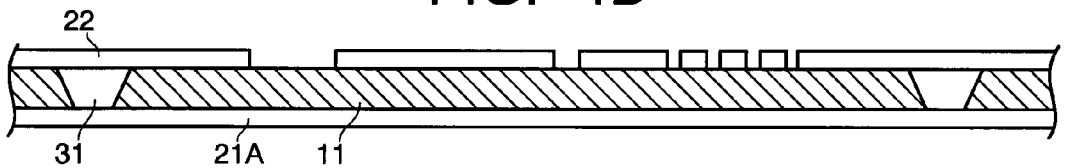
Figure 4E:
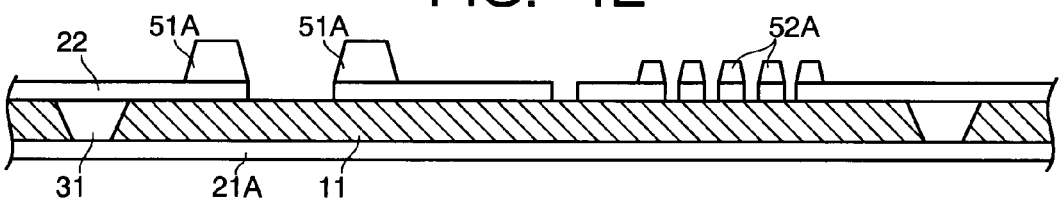

Following above, as shown in FIG. 4D, patterning is applied to the metallic foil 22A on one side by, for example, known photolithography, and it is fabricated into a wiring pattern 22 including mounting lands. Further, cream solders 51A and 52A are printed and applied onto the obtained mounting lands by, for example, screen printing as shown in FIG. 4E. The cream solders 51A and 52A can be printed easily into a prescribed pattern by screen printing. A dispenser can also be used instead of the screen printing.

Instead of the cream solders 51A and 52A, a conductive composition before curing may be used. When the conductive composition is used, heat resistance is high after curing and occurrence of a defective connection by heat applied when components are mounted on the completed wiring board can be prevented effectively.

Figure 4F:
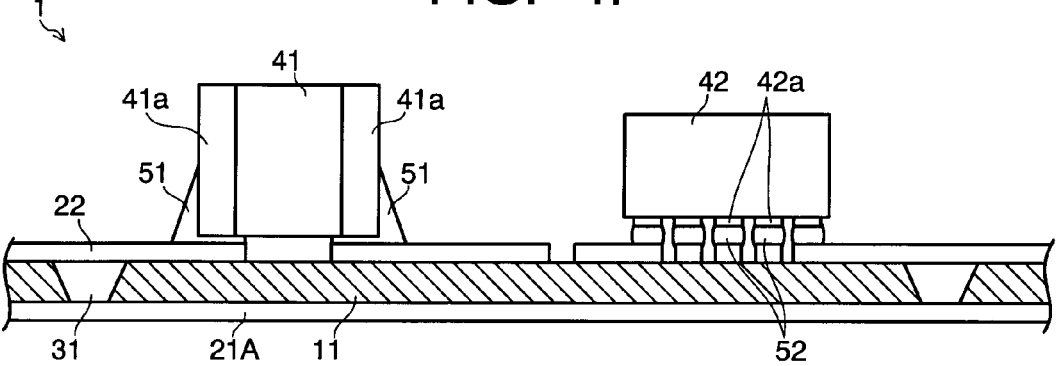

Following above, the chip component 41 and the semiconductor element 42 are placed on the mounting lands via the cream solders 51A, 52A by, for example, a mounter, and heating (for example, 220° C. to 250° C.) is performed to reflow the cream solders 51A and 52A. Thus, a wiring board material 1 having the chip component 41 and the semiconductor element 42 connected to the mounting lands of the wiring layer 22 via the connecting members 51 and 52 is obtained as shown in FIG. 4F. A process using the wiring board material 1 is described later with reference to FIG. 6.

The composition of the solder particles dispersed in the cream solders 51A and 52A may be, for example, a lead-free solder (Sn-3Ag-0.5Cu) mainly consisting of tin. To make remelting hard to occur, it is also possible to use the composition which is configured to have copper particles dispersed in addition to the solder particles in flux. In such a composition, the solder particles melt at, for example, 217° C. to 221° C. to cover the surfaces of the copper particles. At this time, the tin component in the solder covering the surfaces of the copper particles forms a compound $Cu_6Sn_5$ with copper. Thus, the tin component in the portion excluding the copper particles decreases. The copper particles with their surfaces covered with the copper-tin compound might be mutually coupled partly by the compound $Cu_6Sn_5$.

By the connecting members 51 and 52 formed as described above, a decrease in reliability by remelting can be prevented effectively when this component built-in wiring board is subjected to mounting of components. Namely, the compound $Cu_6Sn_5$ has a high melting point of 600° C. or more and does not melt when the components are mounted. In addition, tin in the portion excluding the copper particles has decreased in comparison with that in the original solder particles, and even when remelted, its change in volume is small, and an influence to surroundings is suppressed. Thus, reliability as the component built-in wiring board becomes not to decrease easily.

The copper particles in the cream solders 51A and 52A can be another metal, for example, metallic particles of silver, gold, aluminum or copper-tin alloy. Solder particles having a composition of, for example, Sn-3Ag-0.5Cu having a particle diameter of, for example, 10 μm to 20 μm can be used. Besides, the copper particles with the surfaces covered with the copper-tin compound in the connecting members 51 and 52 can have a particle diameter of, for example, 3 μm to 40 μm. The ratio of the copper particles in the connecting members 51 and 52 may be, for example, 5 wt % to 50 wt %.

Figure 5A:
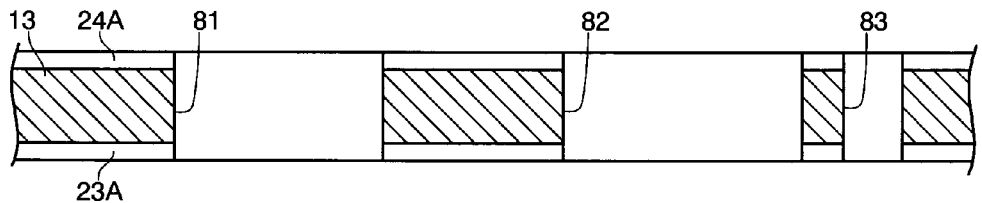
FIG. 5A, FIG. 5B, FIG. 5C, FIG. 5D and FIG. 5E are process charts schematically showing in a sectional view another part of the production process of the component built-in wiring board shown in FIG. 1.

Description is made below with reference to FIG. 5A through FIG. 5E. FIG. 5A through FIG. 5E show a manufacturing process of the portions mainly including the insulating layers 13 and 12 among the constituents shown in FIG. 1. As shown in FIG. 5A, first, prepared is the FR-4 insulating layer 13 having, for example, a thickness of 300 μm which has its both surfaces laminated with metallic foils (electrolytic copper foil) 23A and 24A having, for example, a thickness of 18 μm, opened is a through hole 83 at a prescribed position for forming a through hole conductor, and formed are open portions 81 and 82 for components at portions corresponding to the chip component 41 and the semiconductor element 42 to be built in.

Figure 5B:
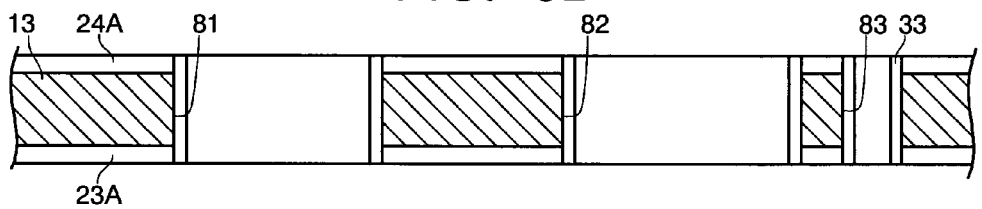
Figure 5C:
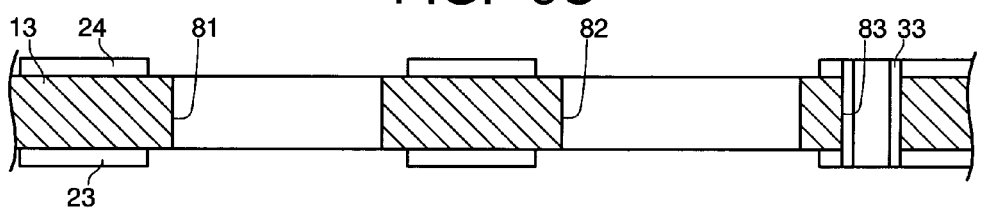

Following above, as shown in FIG. 5B the through hole conductor 33 is formed on the inner wall of the through hole 83 by nonelectrolytic plating and electrolytic plating. The conductor is also formed on the inner walls of the open portions 81 and 82. As shown in FIG. 5C, the metallic foils 23A and 24A are served for prescribed patterning by known photolithography to form the wiring layers 23 and 24. By formation of the wiring layers 23 and 24 by patterning, the conductors formed on the inner walls of the open portions 81 and 82 is also removed.

Figure 5D:
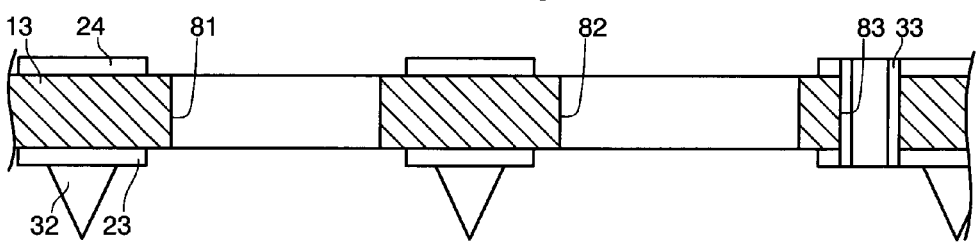
Figure 5E:
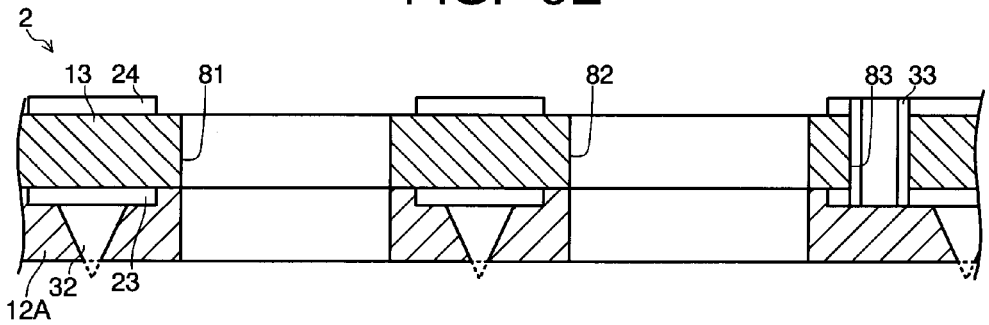

Following above, as shown in FIG. 5D, conductive bumps (a bottom diameter of, for example, 200 μm, and a height of, for example, 160 μm) which become interlayer connectors 32 are formed at prescribed positions on the wiring layer 23 by screen printing of a paste-like conductive composition. Subsequently, as shown in FIG. 5E an FR-4 prepreg 12A (a nominal thickness of, for example, 100 μm) that is to be the insulating layer 12 is laminated on the side of the wiring layer 23 by a press machine. The prepreg 12A is previously provided with an open portion at positions corresponding to the built-in chip component 41 and the semiconductor element 42 similar to the insulating layer 13.

Heads of the interlayer connectors 32 penetrate through the prepreg 12A by the laminating process of FIG. 5E. The broken line indicating the head of the interlayer connector 32 in FIG. 5E indicates two cases in which the head is crushed by plastic deformation at this stage and not deformed plastically. The wiring board material obtained above is denoted as the wiring board material 2.

The above processes shown in FIG. 5A through FIG. 5E can also be performed by the subsequent procedures. Only the through hole 83 is formed at the stage shown in FIG. 5A, and the processes from FIG. 5B to FIG. 5D are performed without forming the open portions 81 and 82 for the built-in components. Then, as a process corresponding to that of FIG. 5E, the prepreg 12A (without an opening) is laminated. Further, open portions for components to be built in are formed in the insulating layer 13 and the prepreg 12A at the same time.

Figure 6:
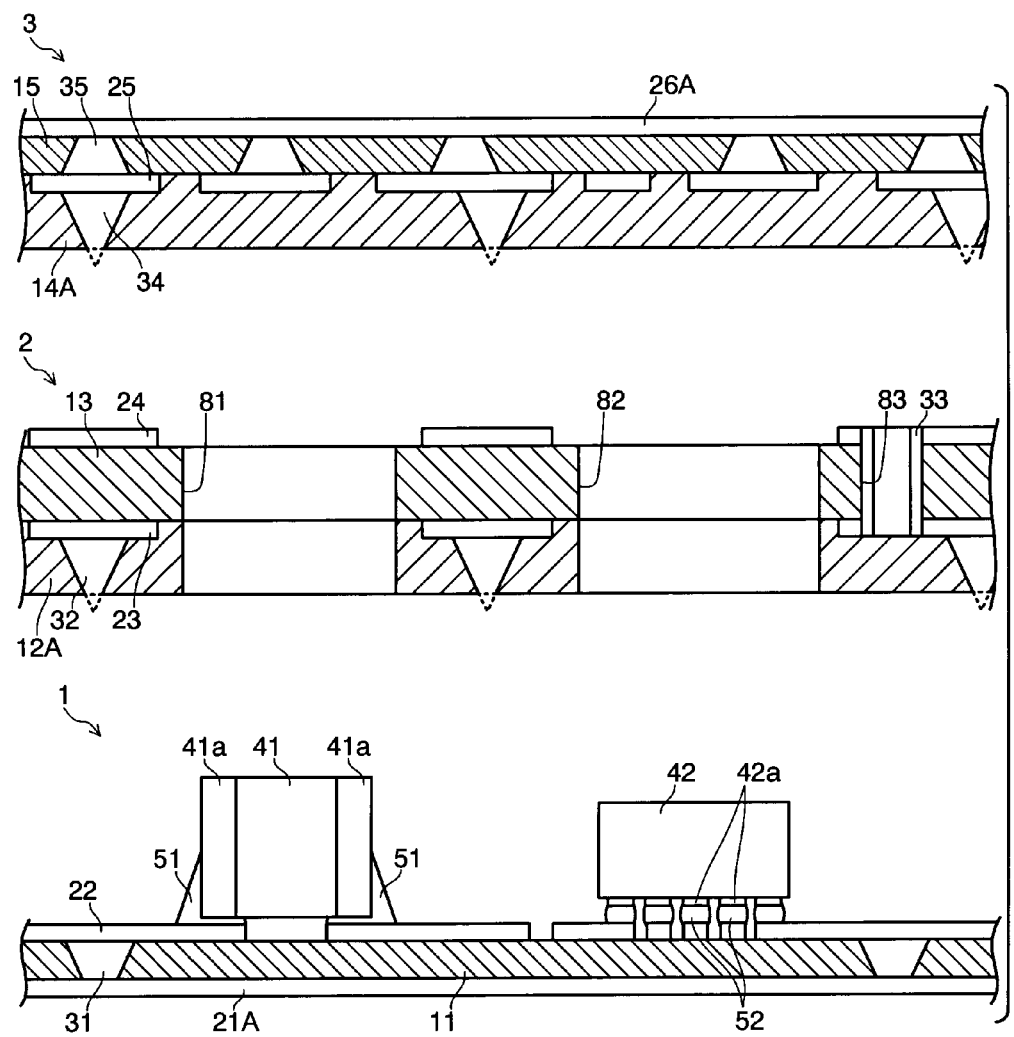
FIG. 6 is a process chart schematically showing in a sectional view still another part of the production process of the component built-in wiring board shown in FIG. 1.

Description is made below with reference to FIG. 6. FIG. 6 is a diagram showing an arrangement relationship for lamination of the above-obtained wiring board materials 1, 2, and so forth. Here, the wiring board material 3 at the top in the drawing is obtained by applying the same process as that for the wiring board material 1 shown at the bottom, and then forming the interlayer connectors 34 and a prepreg 14A by the same manner as the interlayer connectors 32 and the prepreg 12A of the wiring board material 2 shown at the middle of the drawing.

The wiring board material 3, however, is configured without the components (the chip component 41 and the semiconductor element 42) and a part (mounting land) for connecting them, and the prepreg 14A is not formed with an open portion for the chip component 41 and an open portion for the semiconductor element 42. A metallic foil (electrolytic copper foil) 26A, the insulating layer 15, the interlayer connector 35, the wiring layer 25, the prepreg 14A, and the interlayer connector 34 are same as the metallic foil 21A, the insulating layer 11, the interlayer connector 31, and the wiring layer 22 in the wiring board material 1, and the prepreg 12A, and the interlayer connector 32 in the wiring board material 2, respectively.

The individual wiring board materials 1, 2 and 3 are laminated in the arrangement as shown in FIG. 6 and then pressed and heated by a press machine. Thereby, the prepregs 12A and 14A are cured completely to be laminated and integrated wholly. At this time, flowability of the prepregs 12A and 14A resulting from heating makes them deform and penetrate to fill the space around the chip component 41 and the semiconductor chip 42 and the space within the through hole conductor 33 without causing any void. Further, the wiring layers 22 and 24 are electrically connected to the interlayer connectors 32 and 34, respectively.

To prevent an occurrence of a defect such as breakage in the semiconductor element 42 by releasing the pressing force applied to it in the press process, preferable is that the height of the semiconductor element 42 is determined to be slightly lower than that of the chip component 41. This is because the number of the semiconductor element 42 is small (for example, one), and the chip components 41 are arranged to surround them according to many applications. The chip components 41 arranged as described above receive the pressing force more, and the pressing force applied to the semiconductor element 42 is reduced.

After the laminating process shown in FIG. 6, the metallic foils 26A and 21A on both surfaces are subjected to prescribed patterning by known photolithography, and then the layers of the solder resists 61 and 62 are formed. Thus, the component built-in wiring board shown in FIG. 1 can be obtained.

As a modified embodiment, it is natural to make the through hole conductor 33 that is formed in the mid insulating layer 13 exchanged for one configured similar to the interlayer connectors 31 and 32. Further, the interlayer connectors 31, 32, 34 and 35 can be adopted by suitably selecting from those resulting from, for example, metal bumps formed by etching a metallic plate, a connector formed by filling a conductive composition, conductor bumps formed by plating, and so forth other than those resulting from the conductive bumps obtained by the above-described conductive composition printing. The outside wiring layers 21 and 26 may be formed at the stage of the individual wiring board materials 1 and 3 (for example, the stage of FIG. 4D) other than the case obtained by patterning after the last laminating process.

In the laminating process shown in FIG. 6, as for the wiring board materials 1 and 2 the prepreg 12A and the interlayer connector 32 may be formed not on the side of the wiring board material 2 but on the side of the wiring board material 1. Namely, the formation of the interlayer connector 32 and the lamination of the prepreg 12A may be previously performed on the wiring layer 22 (on the insulating layer 11) of the wiring board material 1. In this case, the mounted chip component 41 and semiconductor element 42 seem to become a cause of interference when the interlayer connector 32 is formed by screen printing but do not become a cause of interference in practice when the components of the chip component 41 and the semiconductor element 42 are thin enough. In the laminating process of the prepreg 12A, the prepreg 12A can be laminated uniformly in an in-plane direction by pressing and heating with intervention of a cushion material which can absorb the thickness of the chip component 41 and the semiconductor element 42.

Figure 7:
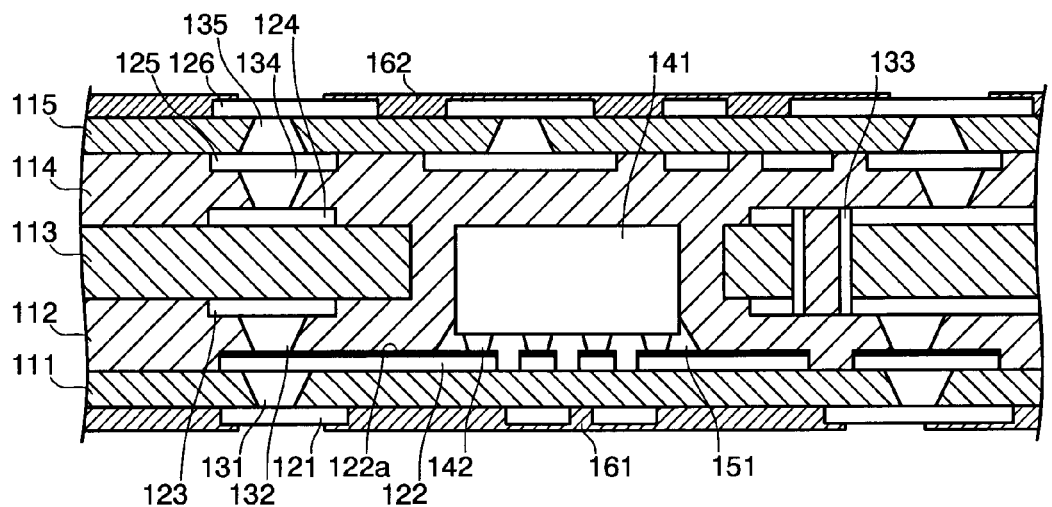
FIG. 7 is a sectional view schematically showing a structure of the component built-in wiring board according to another embodiment of the invention.

FIG. 7 is a sectional view schematically showing a structure of the component built-in wiring board according to another embodiment of the invention. As shown in FIG. 7, this component built-in wiring board has an insulating layer 111 (first insulating layer), insulating layers 112, 113, 114 and 115 (112, 113, 114 and 115 indicate a second insulating layer), a wiring layer 121, a wiring layer 122 (wiring pattern), a wiring layer 123 (second wiring pattern), wiring layers 124, 125 and 126 (=six layers in total), interlayer connectors 131, 132, 134 and 135, a through hole conductor 133, a semiconductor chip 141, conductive bumps 142, and an underfill resin 151 (resin).

The semiconductor chip 141 is electrically and mechanically connected to the inner wiring layer 122 via the conductive bumps 142 by flip connection. For this connection, the conductive bumps 142 are previously formed on the terminal pads (not shown) possessed by the semiconductor chip 141, and built-in component mounting lands of the wiring layer 122 are formed in a pattern in alignment with the conductive bumps 142. The conductive bumps 142 are made of, for example, Au as the material, and preciously formed in a stud shape on the terminal pads. The underfill resin 151 is filled between the semiconductor chip 141 and both the wiring layer 122 and the insulating layer 111 for mechanical and chemical protection of the flip connection portion.

The surface of the wiring layer 122 on the side of the insulating layer 112 including a portion used for connection with the conductive bumps 142 is a roughened surface 122a which is processed to have a suitably large surface roughness. By providing the roughened surface 122a, a low resistance of the connection with the conductive bumps 142 and its reliability are secured. Thus, it is not necessary to consider that Au plating should be applied in order to enhance the cleanness of the surface of the wiring layer 122 on the side of the insulating layer 112 and a solder resist layer should be formed not to increase the plated area as much as possible. Therefore, a lower cost can be realized, and it is also possible to avoid a possibility that the function as the wiring board is ruined because of incomplete adhesion between the insulating layer 112 and the Au plated layer or the solder resist layer.

A structure other than altering the surface of the wiring layer 122 to the roughened surface 122a, namely a structure itself configured of the semiconductor chip 141, the conductive bumps 142, the wiring layer 122, the insulating layer 111 and the underfill resin 151 may be a structure which can be obtained by a generally and frequently used flip connection, and therefore, a large cost increase does not occur. The roughened surface 122a also contributes to improvement of adhesion between the wiring layer 122 and the insulating layer 112 and improvement of the reliability of the electrical connection between the wiring layer 122 and the interlayer connector 132, being also preferable secondarily.

Figure 8:
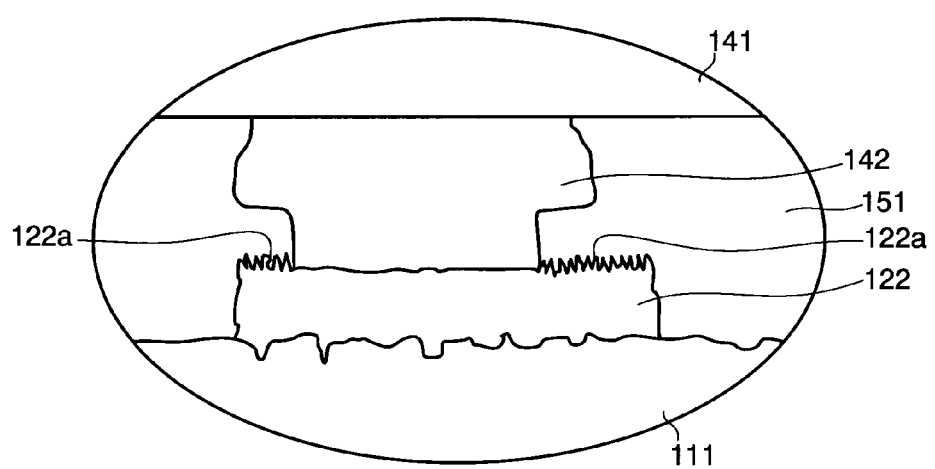
FIG. 8 is a sectional structure view schematically showing in more detail a connection portion between a semiconductor chip 41 and a wiring layer 22 of the component built-in wiring board shown in FIG. 7.

A microstructure of the connection portion between the semiconductor chip 141 and the wiring layer 122 is described below with reference to FIG. 8. FIG. 8 is a sectional structure view schematically showing in more detail the connection portion between the semiconductor chip 141 and the wiring layer 122 of the component built-in wiring board shown in FIG. 7. In FIG. 8, like constituents corresponding to those shown in FIG. 7 are denoted by like reference numerals. As shown in FIG. 8, irregularity of the roughened surface 122a of the wiring layer 122 is crushed with the conductive bump 142 press-contacted to the wiring layer 122 in the microstructure, and thus a newly generated surface of the wiring layer 122 is exposed and contacted to the conductive bump 142. Therefore, good connection is realized.

Referring back to FIG. 7, another structure of the component built-in wiring board is described below. The wiring layers 122, 123, 124 and 125 different from the outside wiring layers 121 and 126 are inner wiring layers, and sequentially, the insulating layer 111 is positioned between the wiring layer 121 and the wiring layer 122, the insulating layer 112 is positioned between the wiring layer 122 and the wiring layer 123, the insulating layer 113 is positioned between the wiring layer 123 and the wiring layer 124, the insulating layer 114 is positioned between the wiring layer 124 and the wiring layer 125, and the insulating layer 115 is positioned between the wiring layer 125 and the wiring layer 126, thereby separating the wiring layers 121 to 126. The individual wiring layers 121 to 126 are made of, for example, a metallic (copper) foil having a thickness of 18 μm.

The individual insulating layers 111 to 115 excepting the insulating layer 113 have a thickness of, for example, 100 μm, the insulating layer 113 has a thickness of, for example, 300 μm, and they are rigid materials made of, for example, a glass epoxy resin. Particularly, the insulating layer 113 has an open portion at a position corresponding to the embedded semiconductor chip 141 to provide a space for embedding the semiconductor chip 141. The insulating layers 112 and 114 deform and penetrate to fill the above-described open portion of the insulating layer 113 for the embedded semiconductor chip 141 and the space within the through hole conductor 133 of the insulating layer 113, and there is not a space therein which becomes a void.

The wiring layer 121 and the wiring layer 122 can be electrically conducted by the interlayer connector 131 which is sandwiched between their pattern surfaces and formed to penetrate through the insulating layer 111. Similarly, the wiring layer 122 and the wiring layer 123 can be electrically conducted by the interlayer connector 132 which is sandwiched between their pattern surfaces and formed to penetrate through the insulating layer 112. The wiring layer 123 and the wiring layer 124 can be electrically conducted by the through hole conductor 133 which is formed to penetrate through the insulating layer 113. The wiring layer 124 and the wiring layer 125 can be electrically conducted by the interlayer connector 134 which is sandwiched between their pattern surfaces and formed to penetrate through the insulating layer 114. The wiring layer 125 and the wiring layer 126 can be electrically conducted by the interlayer connector 135 which is sandwiched between their pattern surfaces and formed to penetrate through the insulating layer 115.

The interlayer connectors 131, 132, 134 and 135 are resulting from the conductive bumps which are formed by screen printing of a conductive composition, and their diameters are varied in the axial direction (the vertical layered direction in FIG. 7) according to the manufacturing process. Their diameters are, for example, 200 μm on the larger side.

As described above, the component built-in wiring board according to this embodiment has a feature that the surface of the wiring layer 122 as an inner layer including the lands on the side of the insulating layer 112 is roughened to finely bury and mount the semiconductor chip 141 by flip connection via the conductive bumps 142 formed on the terminal pads. Thereby, a low resistance connection between the semiconductor chip 141 and the wiring layer 122 and their connection reliability are improved. The adhesion between the wiring layer 122 having the roughened surface 122a and the insulating layer 112 is good, and no adverse effect is caused on the functionality as the wiring board. The reliability of the electrical connection between the wiring layer 122 and the interlayer connector 132 is also improved.

The manufacturing process of the component built-in wiring board shown in FIG. 7 is described below with reference to FIG. 9A through FIG. 9F, FIG. 10A through FIG. 10E, and FIG. 11. These drawings are process charts schematically showing in a sectional view a part of the production process of the component built-in wiring board shown in FIG. 7. In these drawings, like or equivalent constituents corresponding to those shown in FIG. 7 are denoted by like reference numerals.

Figure 9A:
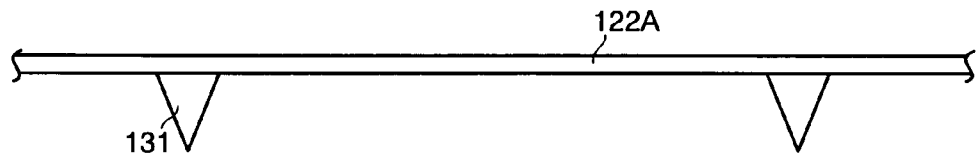
FIG. 9A through FIG. 9F are process charts schematically showing in a sectional view part of the production process of the component built-in wiring board shown in FIG. 7.

Description is made below with reference to FIG. 9A through FIG. 9F first. FIG. 9A through FIG. 9F show manufacturing processes of a portion mainly including the insulating layer 111 among the individual constituents shown in FIG. 7. As shown in FIG. 9A, first a paste-like conductive composition which becomes the interlayer connector 131 is formed into a nearly conical bump shape (a bottom diameter of, for example, 200 μm, and a height of, for example, 160 μm) on a metallic foil (electrolytic copper foil) 122A having a thickness of, for example, 18 μm by, for example, screen printing. This conductive composition has metallic microscopic particles of silver, gold or copper or carbon microscopic particles dispersed into a paste-like resin. For convenience of explanation, printing is made on the bottom surface of the metallic foil 122A but may be made on the top surface (the same is also applied to the following drawings). After the interlayer connector 131 is printed, it is cured by drying.

Figure 9B:
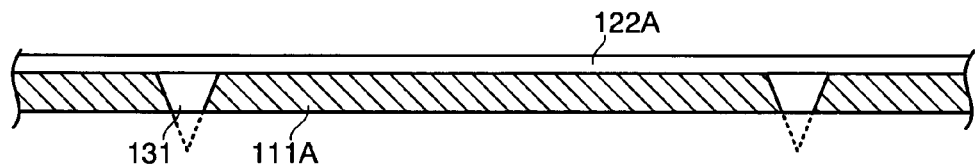
Figure 9C:
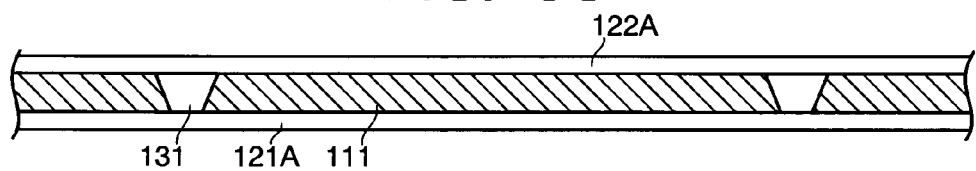

Following above, as shown in FIG. 9B, an FR-4 prepreg 111A having a nominal thickness of, for example, 100 μm is laminated on the metallic foil 122A allowing the interlayer connectors 131 to penetrate through it, so that their heads are exposed. At the time of exposure or after that, the tip end may be crushed by plastic deformation (in any event, the interlayer connector 131 has an axis corresponding to the layered direction with its diameter varied in the axial direction). Subsequently, a metallic foil (electrolytic copper foil) 121A is laminated on a prepreg 131A, and as shown in FIG. 9C they are integrated by pressing and heating. At this time, the metallic foil 121A falls in a state of being electrically conducting with the interlayer connector 131, and the prepreg 111A cures completely to become the insulating layer 111.

Figure 9D:
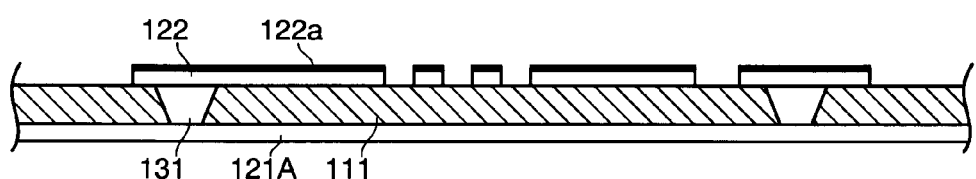

Following above, as shown in FIG. 9D, patterning is applied to the metallic foil 122A on one side by, for example, known photolithography, and it is fabricated into the wiring layer 122 including mounting lands. Then, a roughening treatment is performed onto the surface of the patterned wiring layer 122 to form the roughened surface 122a. Specifically, for example, a blackening/reducing process or a micro-etching process can be adopted. As the micro-etching process, for example, a CZ processing (MEC Co., Ltd., trade name) or a bond film processing (Atotech, trade name) is used.

Since the processing of roughening the surface of the copper foil is generally performed to improve the adhesiveness to an insulation resin laminated on the copper foil, the above-described roughening treatment may be performed as a simultaneous processing. Thus, it is not necessary to perform the above roughening treatment as new processing, and the manufacturing can be made efficiently. The degree of roughening, however, should be appropriately determined based on considering the low resistance in the flip connection and its reliability (described later).

Figure 9E:
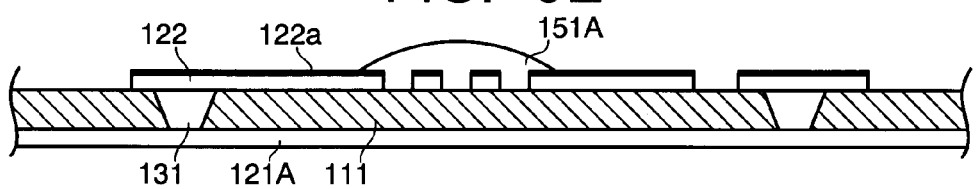
Figure 9F:
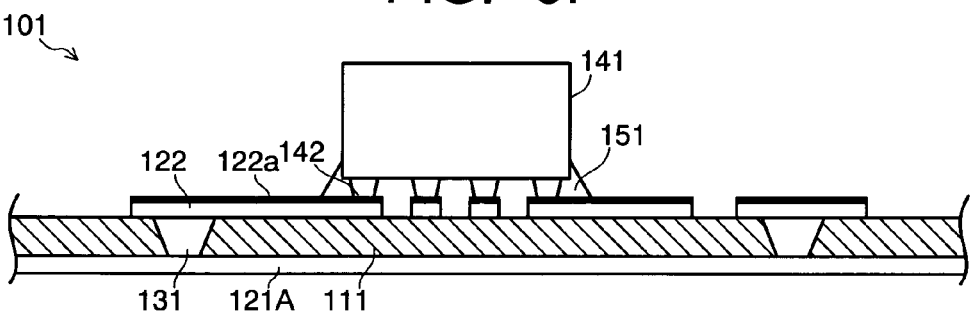

Following above, as shown in FIG. 9E, an underfill resin 151A before curing is applied onto a position on the insulating layer 111 where the semiconductor chip 141 is to be mounted, by, for example, a dispenser. Subsequently, as shown in FIG. 9F, the semiconductor chip 141 accompanying the conductive bumps 142 is aligned to the mounting lands of the wiring layer 122 and press-contacted by using, for example, a flip chip bonder. After the press contacting, a heating process is performed to improve the connection strength and to cure the underfill resin 151A. Thus, there is obtained a wiring board material 101 in which the semiconductor chip 141 is connected onto the mounting lands of the wiring layer 122 via the conductive bumps 142, and having the underfill resin 151 filled between the semiconductor chip 141 and both the wiring layer 122 and the insulating layer 111. A later process using the obtained wiring board material 101 is described later with reference to FIG. 11.

Figure 10A:
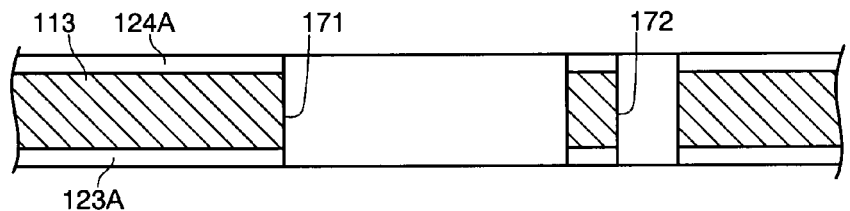
FIG. 10A through FIG. 10E are process charts schematically showing in a sectional view another part of the production process of the component built-in wiring board shown in FIG. 7.

Description is made below with reference to FIG. 10A through FIG. 10E. FIG. 10A through FIG. 10E show manufacturing processes of a portion mainly including the insulating layers 113 and 112 among the individual constituents shown in FIG. 7. As shown in FIG. 10A, first, prepared is the FR-4 insulating layer 113 having, for example, a thickness of 300 μm having metallic foils (electrolytic copper foils) 123A and 124A having, for example, a thickness of 18 μm laminated on its both surfaces, opened is a through hole 172 at a prescribed position for forming a through hole conductor, and formed is an open portion 171 at a portion corresponding to the semiconductor chip 141 to be built in.

Figure 10B:
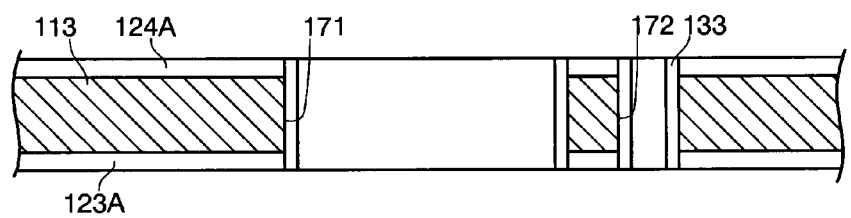
Figure 10C:
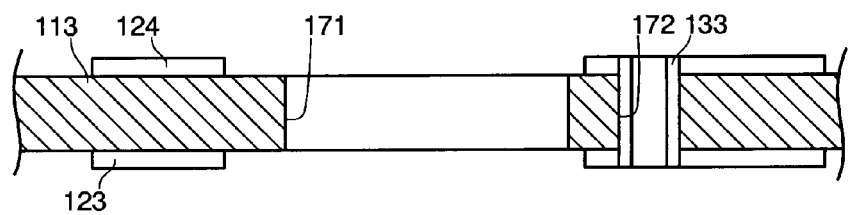

Following above, nonelectrolytic plating and electrolytic plating are performed to form the through hole conductor 133 on the inner wall of the through hole 172 as shown in FIG. 10B. The conductor is also formed on the inner wall of the open portion 171. Further, the metallic foils 123A and 124A are subjected to a prescribed patterning by known photolithography to form the wiring layers 123 and 124 as shown in FIG. 10C. By patterning formation of the wiring layers 123 and 124, the conductor formed on the inner wall of the open portion 171 is also removed.

Figure 10D:
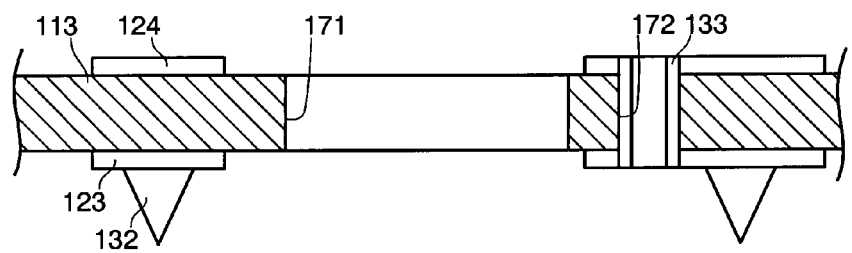
Figure 10E:
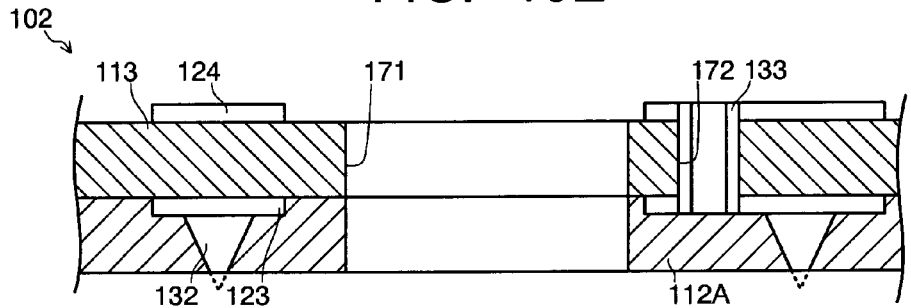

Following above, as shown in FIG. 10D, conductive bumps (a bottom diameter of, for example, 200 μm, and a height of, for example, 160 μm) which become the interlayer connectors 132 are formed at prescribed positions on the wiring layer 123 by screen printing of a paste-like conductive composition. Subsequently, as shown in FIG. 10E an FR-4 prepreg 112A (a nominal thickness of, for example, 100 μm) that is to be the insulating layer 112 is laminated on the wiring layer 123 by a press machine. The prepreg 112A is previously provided with an open portion at a position corresponding to the semiconductor chip 141 to be built in similar to the insulating layer 113.

Heads of the interlayer connectors 132 penetrate through the prepreg 112A by the laminating process. The broken line indicating the head of the interlayer connector 132 in FIG. 10E indicates two cases in which the head is crushed by plastic deformation at this stage and not deformed plastically. This process causes the wiring layer 123 to sink into the prepreg 112A. The wiring board material obtained above is denoted as a wiring board material 102.

The above processes shown in FIG. 10A through FIG. 10E can also be performed by the subsequent procedures. Only the through hole 172 is formed at the stage shown in FIG. 10A, and the processes from FIG. 10B to FIG. 10D are performed without forming the open portion 171 for the built-in component. Then, the prepreg 112A (without an opening) is laminated in a process corresponding to that of FIG. 10E. Further, open portions for components to be built in are formed in the insulating layer 113 and the prepreg 112A at the same time.

Figure 11:
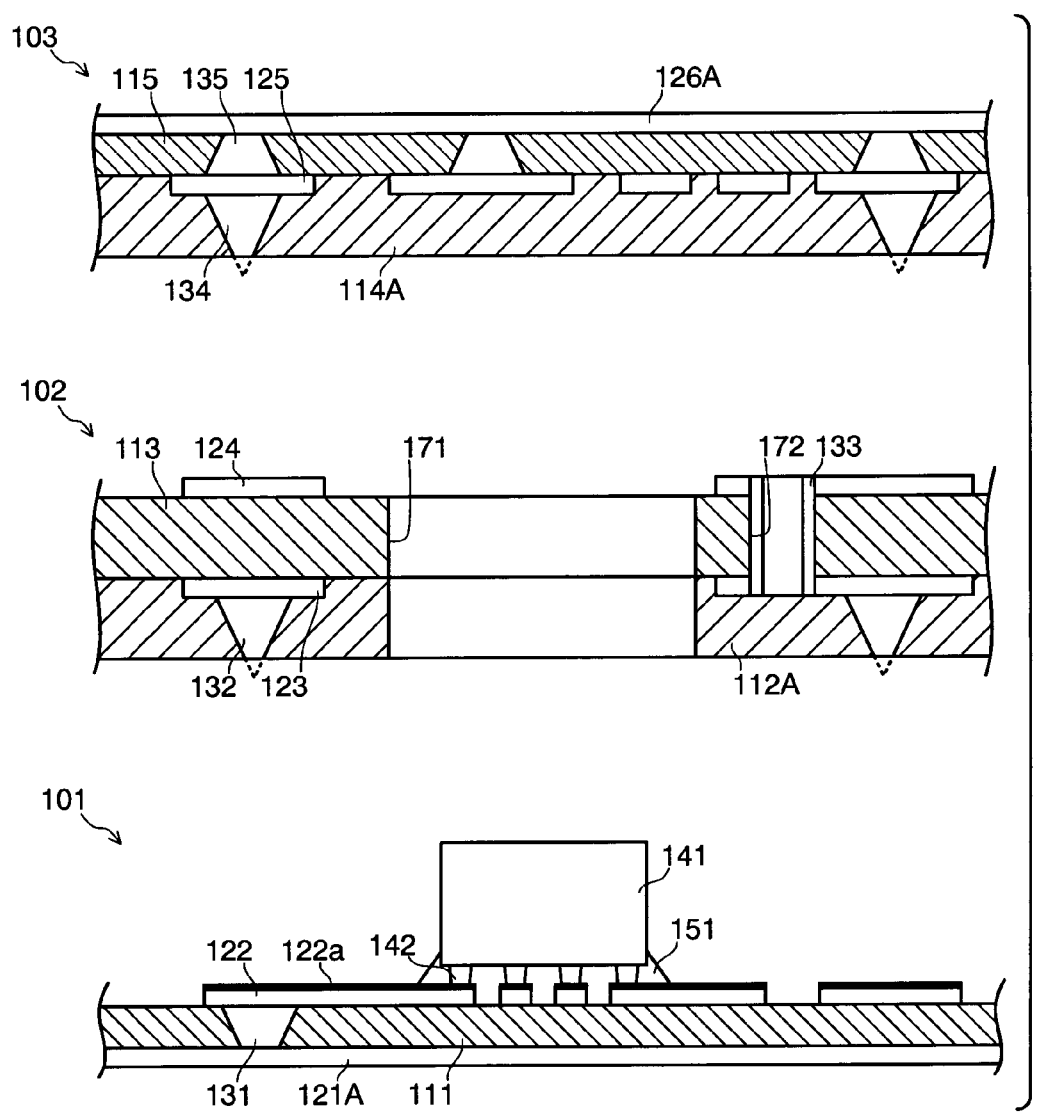
FIG. 11 is a process chart schematically showing in a sectional view still another part of the production process of the component built-in wiring board shown in FIG. 7.

Description is made below with reference to FIG. 11. FIG. 11 is a diagram showing an arrangement relationship for lamination of the above-obtained wiring board materials 101, 102, and so forth.

In FIG. 11, a wiring board material 103 at the top in the drawing is obtained by applying the same process as that for the wiring board material 101 at the bottom, and then forming the interlayer connector 134 and a prepreg 114A by the same manner as that for the interlayer connector 132 and the prepreg 112A of the mid wiring board material 102 shown. The wiring board material 103, however, is configured without the component (semiconductor chip 141) and the part (mounting land) for connecting it, and the prepreg 114A is not formed with an open portion for the semiconductor chip 141. A metallic foil (electrolytic copper foil) 126A, the insulating layer 115, the interlayer connector 135, the wiring layer 125, the prepreg 114A, and the interlayer connector 134 are same as the metallic foil 121A, the insulating layer 111, the interlayer connector 131, and the wiring layer 122 in the wiring board material 101, and the prepreg 112A, and the interlayer connector 132 in the wiring board material 102, respectively.

The individual wiring board materials 101, 102 and 103 are laminated in the arrangement as shown in FIG. 11 and then pressed and heated by a press machine. Thereby, the prepregs 112A and 114A are cured completely to be laminated and integrated wholly. At this time, flowability of the prepregs 112A and 114A resulting from heating makes them deform and penetrate to fill the space around the semiconductor chip 141 and the space in the through hole conductor 133 without causing any void. Further, the wiring layers 122 and 124 are electrically connected to the interlayer connectors 132 and 134, respectively. In this laminating process, since the roughened surface 122a is formed on the surface of the wiring layer 122, adhesiveness of the insulating layer 112 and the wiring layer 122 is improved, and the reliability of electrical connection between the interlayer connector 132 and the wiring layer 122 is improved as described above.

After the laminating process shown in FIG. 11, the metallic foils 126A and 121A on both surfaces are subjected to prescribed patterning by known photolithography, and then the layers of solder resists 161 and 162 are formed. Thus, the component built-in wiring board shown in FIG. 7 can be obtained.

As a modified embodiment, it is natural to make the through hole conductor 133 that is formed in the mid insulating layer 113 exchanged for one configured similar to the interlayer connectors 131 and 132. Further, the outside wiring layers 121 and 126 may be formed at the stage of the individual wiring board materials 101 and 103 (for example, the stage of FIG. 10D) other than the case obtained by patterning after the last laminating process.

In the laminating process shown in FIG. 11, as for the wiring board materials 101 and 102 the portions of the prepreg 112A and the interlayer connector 132 may be formed not on the side of the wiring board material 102 but on the side of the wiring board material 101. Namely, the formation of the interlayer connector 132 and the lamination of the prepreg 112A may be previously performed on the wiring layer 122 (on the insulating layer 111) of the wiring board material 101. In this case, the mounted semiconductor chip 141 seems to become a cause of interference when the interlayer connector 132 is formed by screen printing but does not become a cause of interference in practice when the component of the semiconductor chip 141 is thin enough. In the laminating process of the prepreg 112A, the prepreg 112A can be laminated uniformly in an in-plane direction by pressing and heating with intervention of a cushion material which can absorb the thickness of the semiconductor chip 141.

The results of functional evaluation after actually producing samples of the component built-in wiring board shown in FIG. 7 are described below with reference to FIG. 12A and FIG. 12B. FIG. 12A and FIG. 12B are tables showing the results of functional evaluation in actually produced samples of the component built-in wiring board shown in FIG. 7. As a premise, FIG. 12A shows specifications of the built-in semiconductor chip 141. The used semiconductor chip 141 is a test chip for evaluation. As shown in FIG. 12A, the specifications include a size of 3.0 mm×3.0 mm, a thickness of 200 μm, a number of terminals of 30 pins, and a terminal pitch of 300 µm, and Au stud bumps are formed as the conductive bumps 142.

As shown in FIG. 12B, 100 samples were manufactured as component built-in wiring boards to compare cases in which the roughening treatment of the wiring layer 122 is performed and not performed. Individual bumps were evaluated for connection resistance, initial conduction, and conduction after a thermal shock test.

As to the connection resistance of each bump, the samples with bumps having connection resistance of not less than 10 mΩ in per bump were judged as "conduction NG" (defective conduction). As a result, as shown in the table, the samples having the wiring layer 122 with the roughening treatment had an NG occurrence rate of 0% by the initial conduction evaluation, while the samples without the roughening treatment had an NG occurrence rate of 15%. In addition, in the samples not judged as NG by the initial conduction evaluation the same conduction evaluation was done after performing the thermal shock test shown in the table. It was found that the samples with the roughening treatment had continuously an NG occurrence rate of 0%, but in the samples without the roughening treatment, 15 samples were NG (NG occurrence rate of 20%) among 75 samples which were not NG before the thermal shock test.

Therefore, it was confirmed by data that the roughening treatment on the surface of the wiring layer 122 contributes significantly to realization of the low resistance connection between the semiconductor chip 141 and the wiring layer 122 and the improvement of the connection reliability.

FIG. 13 is a table showing particular results, in the evaluation shown in FIG. 12A and FIG. 12B (initial conduction evaluation), of differences in a defect occurrence frequency due to differences in surface roughness after roughening. The surface roughness is indicated by a ten-point surface roughness Rz specified by JIS. In FIG. 13, Rz=0.2 µm corresponds to no roughening treatment in FIG. 12B, and Rz=0.75 µm corresponds to the roughening treatment in FIG. 12B. As shown in FIG. 13, when the surface roughness Rz of the wiring layer 122 after the roughening treatment is large to 0.45 µm, the occurrence of NG is almost eliminated as the initial conduction evaluation. Therefore, it is considered preferable to have Rz exceeding this value. It was also found that even when Rz increases to 2.5 µm, there is no problem as the initial conduction evaluation.

Figure 14:
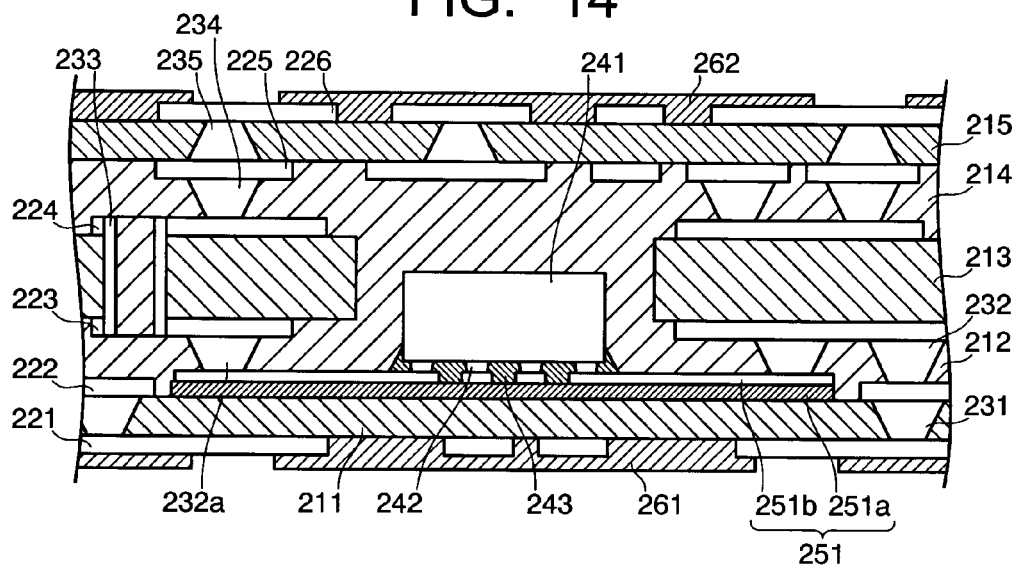
FIG. 14 is a sectional view schematically showing a structure of the component built-in wiring board according to still another embodiment of the invention.

FIG. 14 is a sectional view schematically showing a structure of the component built-in wiring board according to still another embodiment of the invention. As shown in FIG. 14, the component built-in wiring board has insulating layers 211, 212, 213, 214 and 215, wiring layers 221, 222, 223, 224, 225 and 226 (=six layers in total, and the wiring layers 222, 223, 224 and 225 are inner wiring layers), interlayer connectors (vertical conductors) 231, 232, 232a, 234 and 235, a through hole conductor (vertical conductor different from the interlayer connector 231, and so forth) 233, a semiconductor chip 241, conductive bumps 242, an underfill resin 243, an intermediate board 251 (having an insulating plate 251a and a wiring pattern 251b), and solder resists 261 and 262.

This wiring board has the semiconductor chip 241 built in via the intermediate board 251. Namely, the semiconductor chip 241 is previously mounted (flip connected) on the intermediate board 251 to obtain an intermediate mounted board, and this intermediate mounted board is a component to be built in. As this intermediate mounted board, for example, one type of the semiconductor package which is called TCP can be used. The intermediate board 251 in the TCP is generally called as the carrier board.

In the intermediate board 251, formed is the wiring pattern 251b on the insulating plate 251a, the wiring pattern 251b including the lands for mounting the semiconductor chip 241 and the lands to which the interlayer connectors 232a are attached for electrical conduction with the inner wiring layer 223. The electrical connection between the semiconductor chip 241 and the wiring pattern 251b is, for example, made by forming Au (gold) stud-like bumps (conductive bumps 242) on terminal pads (not shown) disposed on the semiconductor chip 241, and press contacting the bumps at prescribed positions of the wiring pattern 251b. A gap between the semiconductor chip 241 and the intermediate board 251 is filled with the underfill resin 243 to reinforce and protect the mounting region including the conductive bumps 242.

Another structure of the component built-in wiring board is described below. The wiring layers 221 and 226 each is an outermost wiring layer, and the wiring layers 222, 223, 224 and 225 are inner wiring layers as described above. The insulating layer 211 is positioned between the wiring layer 221 and the wiring layer 222, the insulating layer 212 is positioned between the wiring layer 222 and the wiring layer 223, the insulating layer 213 is positioned between the wiring layer 223 and the wiring layer 224, the insulating layer 214 is positioned between the wiring layer 224 and the wiring layer 225, and the insulating layer 215 is positioned between the wiring layer 225 and the wiring layer 226, thereby separating the wiring layers 221 to 226 to configure the multilayer wiring board. The individual wiring layers 221 to 226 are made of, for example, a metallic (copper) foil having a thickness of 18 µm.

The individual insulating layers 211 to 215 excepting the insulating layer 213 have a thickness of, for example, 100 µm, the insulating layer 213 has a thickness of, for example, 300 µm and they are rigid materials made of, for example, a glass epoxy resin. Especially, the insulating layer 213 has an open portion at a position corresponding to the embedded semiconductor chip 241 to provide a space for embedding the semiconductor chip 241. The insulating layers 212 and 214 deform and penetrate to fill the above-described open portion of the insulating layer 213 for the embedded semiconductor chip 241 and the space within the through hole conductor 233 of the insulating layer 213, and there is not a space therein which becomes a void.

The wiring layer 221 and the wiring layer 222 can be electrically conducted by the interlayer connector 231 which is sandwiched between their pattern surfaces and formed to penetrate through the insulating layer 211. Similarly, the wiring layer 222 and the wiring layer 223 can be electrically conducted by the interlayer connector 232 which is sandwiched between their pattern surfaces and formed to penetrate through the insulating layer 212. The wiring layer 223 and the wiring layer 224 can be electrically conducted by the through hole conductor 233 formed to penetrate through the insulating layer 213. The wiring layer 224 and the wiring layer 225 can be electrically conducted by the interlayer connector 234 which is sandwiched between their pattern surfaces and formed to penetrate through the insulating layer 214. The wiring layer 225 and the wiring layer 226 can be electrically conducted by the interlayer connector 235 which is sandwiched between their pattern surfaces and formed to penetrate through the insulating layer 215.

Individual components (not shown) can be mounted on the wiring layers 221 and 226. Excepting the land portions of the wiring layers 221 and 226 on which solder (not shown) should be placed by mounting, formed are the solder resists 261 and 262 (their thickness is, for example, about 20 µm) which hold the solder melted at the time of solder connection on the land portions of both main surfaces and then function as the protective layer. A Ni/Au plated layer (not shown) having high corrosion resistance may be formed on the surface layer of the land portions.

The interlayer connectors 231, 232, 232a, 234 and 235 are resulting from the conductive bumps which are formed by screen printing of a conductive composition, and their diameters are varied in the axial direction (the vertical layered direction in FIG. 14) according to the manufacturing process. They have a diameter of, for example, 200 µm on the larger side. The interlayer connector 232a is sandwiched between the inner wiring layer 223 and the top surface of the wiring pattern 251b possessed by the intermediate board 251 and formed to penetrate through the insulating layer 212. Thus, the intermediate mounted board as the built-in component is electrically conducted to the inner wiring layer 223 via the interlayer connector 232a.

The component built-in wiring board configured as described above can remedy the non-adaptation between the wiring rule of a practical multilayer wiring board and the arrangement density of the terminal pads of the semiconductor chip 241 to be built in. Namely, even when the arrangement pitch of the terminal pads of the semiconductor chip 241 is narrower than the wiring rule of the component built-in wiring board, an existence of the intermediate board 251 can make their good matching because the wiring pattern 251b at a conduction portion with the inner wiring layer 223 can be coarsened. Thus, the intermediate mounted board can be handled in the same manner as the ordinary (=the terminal pitch is not narrow) built-in component, it is not necessary to reduce the work size in the production process, and a cost increase can be avoided.

As shown in the drawing, the insulating plate 251a of the intermediate board 251 has a thickness smaller than all of the insulating layers 211 to 215 having a laminated structure. Thus, the limitation of the pattern forming region of the wiring layer as an inner layer due to embedding of the intermediate board 251 occurs on its one layer only (the inner wiring layer 222 in this embodiment) at most. Therefore, an influence on the flexibility of pattern formation of the inner wiring layers 222 to 225 is little, and it is preferable to become little.

In addition, it is possible to perform screening (defect inspection) of the semiconductor chip 241 at the stage of the intermediate mounted board, being different from the case of the structure that the semiconductor chip 241 is directly built in the wiring board. Therefore, it is not necessary to inspect the semiconductor chip 241 after assembling as the multilayer wiring board, and a wasteful cost, caused by the defect of the built-in component, such as a cost in the disposal including expensive added values of the wiring board and the wiring board manufacturing process or the like does not occur.

Besides, the electrical conduction between the intermediate board 251 and the inner wiring layer 223 is made via the interlayer connector 232a, and this interlayer connector 232a can be formed by the same process as that of the interlayer connector 232 for electrically conducting the wiring layer 223 and the wiring layer 222 (details will be described later). Therefore, a process increased for embedding the components is few, and the cost reduction is also realized on this point.

Figure 15A:
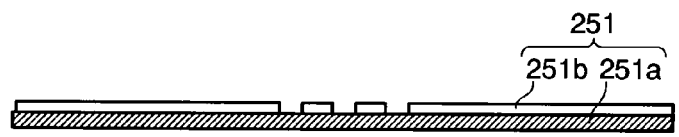
FIG. 15A, FIG. 15B and FIG. 15C are process charts schematically showing in a sectional view an example of the production process of the intermediate mounted board shown in FIG. 14.
Figure 15B:
Figure 15C:
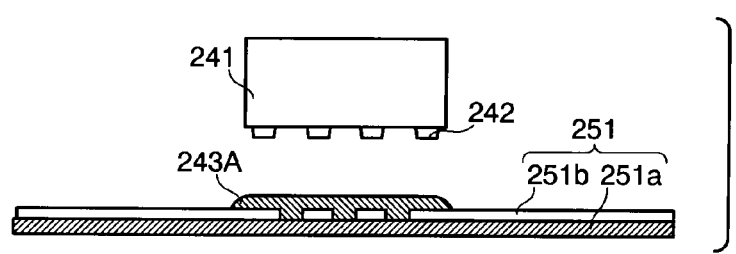

The intermediate mounted board is described for its structure and manufacturing process example with reference to FIG. 15A through FIG. 15C. FIG. 15A through FIG. 15C are process charts schematically showing in a sectional view an example of the production process of the intermediate mounted board shown in FIG. 14. In FIG. 15A and FIG. 15B, like or equivalent constituents corresponding to those of FIG. 14 are denoted by like reference numerals.

First, a laminated plate having a Cu (copper) foil (a thickness of, for example, 9 µm) laminated on the insulating plate 51a of polyimide having a thickness of, for example, 40 µm is prepared, and the Cu foil is subjected to a prescribed patterning to form the wiring pattern 251b (FIG. 15A). The wiring pattern 251b includes the lands for mounting the semiconductor chip 241 and the lands to which the small side of the interlayer connector 232a is attached for electrical conduction with the inner layer 223 as described above. In the above-described TCP, many polyimide insulating plates 251a on which the Cu foil is laminated are first continuously arranged to form a tape shape, the Cu foil in the tape shape can be patterned, and the subsequent process can be performed. Polyimide has flexibility and it is suitably handled in the tape shape.

Following above, as shown in FIG. 15B, an underfill resin 243A before curing is applied to a position on the intermediate board 251 where the semiconductor chip 241 is to be mounted by, for example, a dispenser. Subsequently, as shown in FIG. 15C, the semiconductor chip 241 (a thickness of, for example, 100 µm) accompanying the conductive bumps 242 of Au is aligned to the mounting land of the wiring pattern 251b and press-contacted by using, for example, a flip chip bonder. After the press contacting, a heating process is performed to improve the connection strength and to cure the underfill resin 243A. Thus, the intermediate mounted board on which the semiconductor chip 241 is mounted can be obtained. Alternatively to above, after the semiconductor chip 241 is press-contacted to the wiring pattern 251b, the gap between them may be filled with the underfill resin 243A injected liquidly in capillary action.

FIG. 14 and FIG. 15A through FIG. 15C show the built-in component in which the semiconductor chip 241 is flip-connected to the intermediate board 251. In addition, there can be used a type that for example, the semiconductor chip 241 is face up placed and fixed onto the intermediate board 251, and its terminal pads are connected to the wiring pattern 251b of the intermediate board 251 through bonding wires. In this case, after the bonding wires are installed, the surface of the semiconductor chip 241 and the bonding wire-connected portions on the wiring pattern 251b are covered with a resin, which is then cured to be a protective member therefor.

A manufacturing process of the component built-in wiring board shown in FIG. 14 is described with reference to FIG. 16A through FIG. 16E, FIG. 17A through FIG. 17E and FIG. 18. These drawings are process charts each schematically showing in a sectional view a part of the production process of the component built-in wiring board shown in FIG. 14. In these drawings, like or equivalent constituents corresponding to those shown in FIG. 14 are denoted by like reference numerals.

Description is made below with reference to FIG. 16A through FIG. 16E first. FIG. 16A through FIG. 16E show a manufacturing process of a portion mainly including the insulating layer 211 among the individual constituents shown in FIG. 14. As shown in FIG. 16A, a paste-like conductive composition which becomes the interlayer connector 231 is formed into a nearly conical bump shape (a bottom diameter of, for example, 200 µm, and a height of, for example, 160 µm) on the metallic foil (electrolytic copper foil) 222A having a thickness of, for example, 18 µm by, for example, screen printing. This conductive composition has metallic microscopic particles of silver, gold or copper or carbon microscopic particles dispersed into a paste-like resin. For convenience of explanation, printing is made on the bottom surface of the metallic foil 222A but may be made on the top surface (the same is also applied to the following drawings). After the interlayer connector 231 is printed, it is cured by drying.

Following above, as shown in FIG. 16B, an FR-4 prepreg 211A having a nominal thickness of, for example, 100 μm laminated on the metallic foil 222A allowing the interlayer connectors 231 to penetrate through it, so that their heads are exposed. At the time of exposure or after that, the tip ends may be crushed by plastic deformation (in any event, the interlayer connectors 231 have an axis corresponding to the layered direction with their diameter varied in the axial direction). Subsequently, a metallic foil (electrolytic copper foil) 221A is laminated on a prepreg 231A, and as shown in FIG. 16C they are integrated by pressing and heating. At this time, the metallic foil 221A falls in a state of being electrically conducting with the interlayer connectors 231, and the prepreg 211A cures completely to become the insulating layer 211.

Following above, as shown in FIG. 16D, patterning is applied to the metallic foil 222A on one side by, for example, known photolithography, and it is fabricated into the wiring layer 222. This patterning removes the metallic foil 222A from a region where the intermediate mounted board described below is positioned. This is, however, not exclusive, and the metallic foil 222A may be remained on the region. In this case, the metallic foil 222A on this region is merely contacted to the insulating plate 251a of the intermediate mounted board.

Following above, as shown in FIG. 16E, the above-described intermediate mounted board is placed at a prescribed position on the insulating layer 211 by, for example, a mounter, and in that state, the intermediate mounted board is fixed onto the insulating layer 211. For fixing, for example, an adhesive agent can be applied previously onto the insulating layer 211 or the insulating plate 251a. Thus, a wiring board material which has a state that the intermediate mounted board on which the semiconductor chip 241 is mounted is placed and fixed at the prescribed position can be obtained. A subsequent process using the wiring board material is described later with reference to FIG. 18.

Figure 17A:
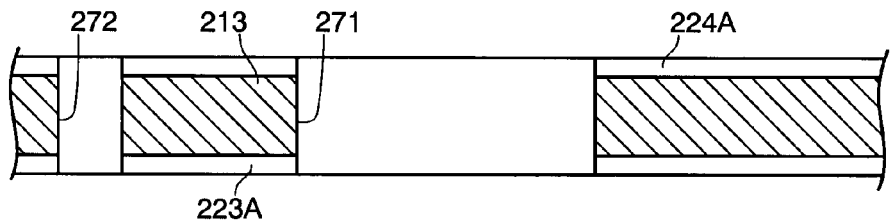
FIG. 17A, FIG. 17B, FIG. 17C, FIG. 17D and FIG. 17E are process charts schematically showing in a sectional view another part of the production process of the component built-in wiring board of FIG. 14.

Description is made below with reference to FIG. 17A through FIG. 17E. FIG. 17A through FIG. 17E show a manufacturing process of the portions mainly including the insulating layers 213 and 212 among the individual constituents shown in FIG. 14. As shown in FIG. 17A, first, prepared is the FR-4 insulating layer 213 having, for example, a thickness of 300 μm which has its both surfaces laminated with metallic foils (electrolytic copper foils) 223A and 224A having, for example, a thickness of 18 μm, opened is a through hole 272 at a prescribed position for forming a through hole conductor, and formed is an open portion 271 at a position corresponding to the semiconductor chip 241 to be built in.

Figure 17B:
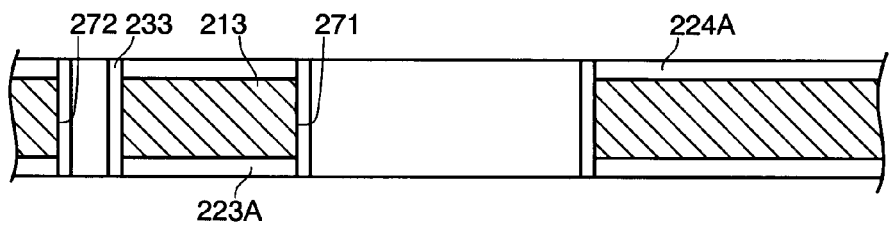
Figure 17C:
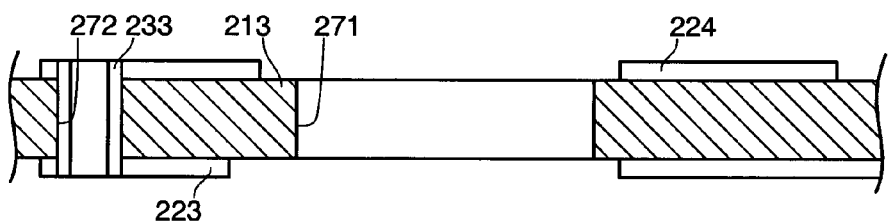

Following above, as shown in FIG. 17B the through hole conductor 233 is formed on the inner wall of the through hole 272 by nonelectrolytic plating and electrolytic plating. The conductor is also formed on the inner wall of the open portion 271. As shown in FIG. 17C, the metallic foils 223A and 224A are served for prescribed patterning by known photolithography to form the wiring layers 223 and 224. By formation of the wiring layers 223 and 224 by patterning, the conductor formed on the inner wall of the open portion 271 is also removed.

Figure 17D:
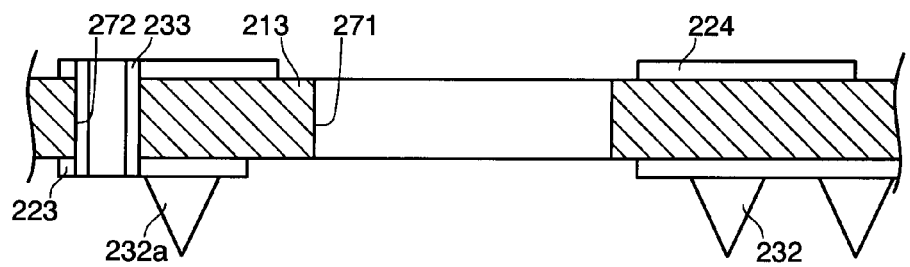
Figure 17E:
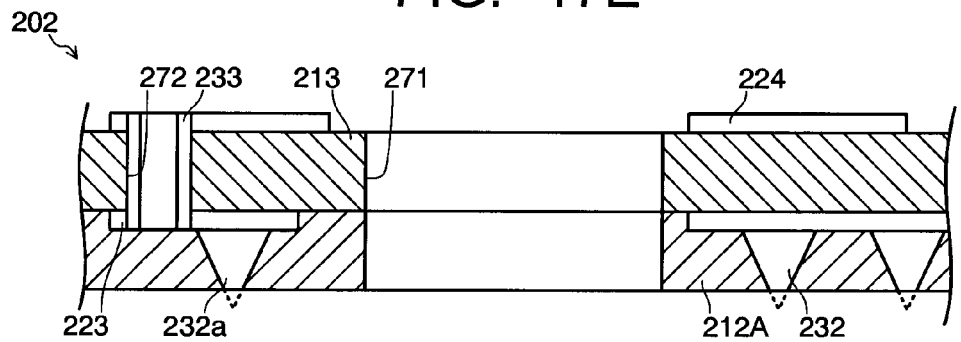

Following above, as shown in FIG. 17D, conductive bumps (a bottom diameter of, for example, 200 μm, and a height of, for example, 160 μm) which become the interlayer connectors 232 and 232a are formed at prescribed positions on the wiring layer 223 by screen printing of a paste-like conductive composition. Subsequently, as shown in FIG. 17E an FR-4 prepreg 212A (a nominal thickness of, for example, 100 μm) that is to be the insulating layer 212 is laminated on the side of the wiring layer 223 by a press machine. The prepreg 212A is previously provided with an open portion at a portion corresponding to the semiconductor chip 241 to be built in similar to the insulating layer 213.

Heads of the interlayer connectors 232 are penetrated through the prepreg 212A by the laminating process. The broken line indicating the heads of the interlayer connectors 232 in FIG. 17E indicates two cases in which the heads are crushed by plastic deformation at this stage and not deformed plastically. This process causes the wiring layer 223 to sink into the prepreg 212A. The wiring board material obtained above is denoted as a wiring board material 202.

The above processes shown in FIG. 17A through FIG. 17E can also be performed by the following procedures. Only the through hole 272 is formed at the stage shown in FIG. 17A, and the processes from FIG. 17B to FIG. 17D are performed without forming the open portion 271 for the built-in component. Then, as a process corresponding to FIG. 17E, the prepreg 212A (without an opening) is laminated. Further, open portions for components to be built in are formed in the insulating layer 213 and the prepreg 212A at the same time.

Figure 18:
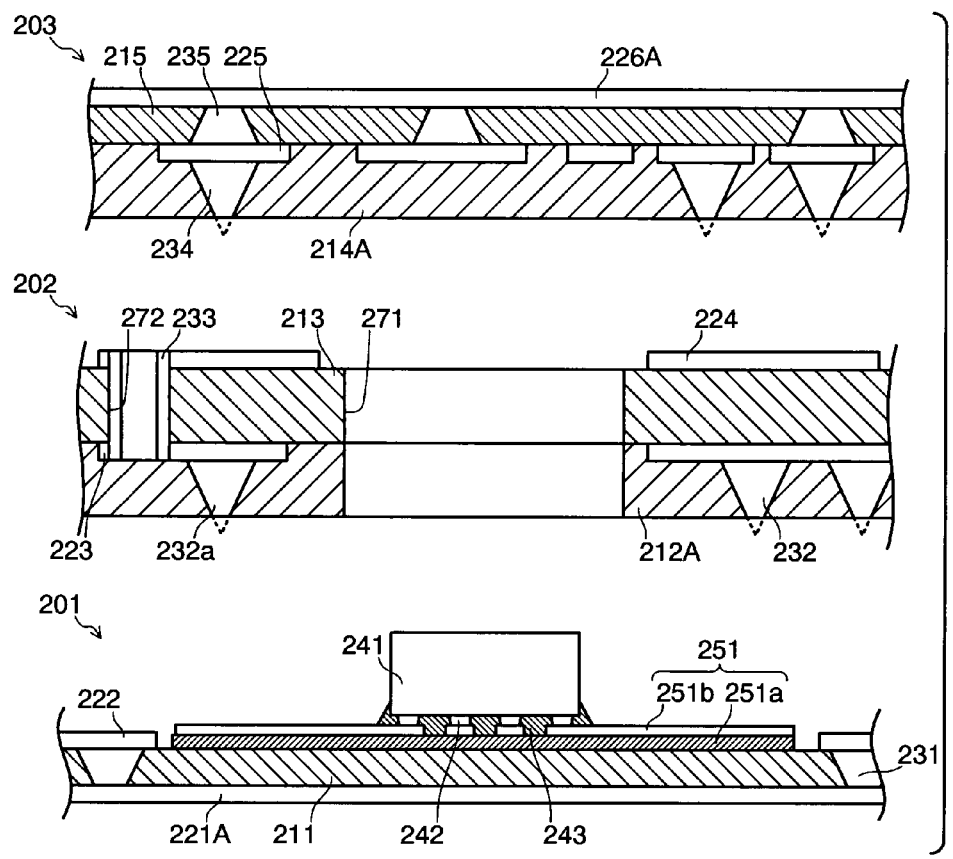
FIG. 18 is a process chart schematically showing in a sectional view still another part of the production process of the component built-in wiring board shown in FIG. 14.

Description is made below with reference to FIG. 18. FIG. 18 is a diagram showing an arrangement relationship for lamination of the above-obtained wiring board materials and so forth. In FIG. 18, a wiring board material 201 at the bottom of the drawing was obtained by the process shown in FIG. 16A through FIG. 16E.

A wiring board material 203 at the top in FIG. 18 is obtained by applying the same process as that of the wiring board material 201 shown at the bottom, and then forming the interlayer connectors 234 and a prepreg 214A by the same manner as the interlayer connectors 232 and 232a and the prepreg 212A of the shown mid wiring board material 22. It is, however, configured without the intermediate mounted board including the semiconductor chip 241, and the prepreg 214A is not provided with an open portion for the semiconductor chip 241. A metallic foil (electrolytic copper foil) 226A, the insulating layer 215, the interlayer connector 235, the wiring layer 225, the prepreg 214A, and the interlayer connector 234 are same as the metallic foil 221A, the insulating layer 211, the interlayer connector 231, and the wiring layer 222 in the wiring board material 201, and the prepreg 212A, and the interlayer connectors 232 and 232a in the wiring board material 202, respectively.

The individual wiring board materials 201, 202 and 203 are laminated in the arrangement as shown in FIG. 18, then pressed and heated by a press machine. Thereby, the prepregs 212A and 214A are cured completely to be laminated and integrated wholly. At this time, flowability of the prepregs 212A and 214A resulting from heating makes them deform and penetrate to fill the space around the semiconductor chip 241 and the space within the through hole conductor 233 without causing any void.

When laminated, the wiring layers 222 and 224 are pressed against the heads of the interlayer connectors 232 and 234 and electrically connected to them, respectively. At the same time, the wiring pattern 251b of the intermediate mounted board is pressed against the head of the interlayer connector 232a and electrically connected to it. Thus, the wiring pattern 251b in the intermediate mounted board as the built-in component is electrically conducted to the inner layer 223 by the interlayer connector 232a formed simultaneously with the interlayer connector 232 as the multilayer wiring board, so that a new process does not arise for the electrical conduction. Therefore, contribution to the cost reduction is realized.

After the laminating process shown in FIG. 18, the metallic foils 226A and 221A on both surfaces are subjected to prescribed patterning by known photolithography, and then the layers of the solder resists 261 and 262 are formed. Thus, the component built-in wiring board shown in FIG. 14 can be obtained.

As a modified embodiment, it is natural to make the through hole conductor 233 that is formed in the mid insulating layer 213 exchanged for one configured similar to the interlayer connectors 231 and 232. Further, the outside wiring layers 221 and 226 may be formed at the stage of the individual wiring board materials 201 and 203 (for example, the stage of FIG. 16D) other than the case obtained by patterning after the last laminating process.

Figure 19:
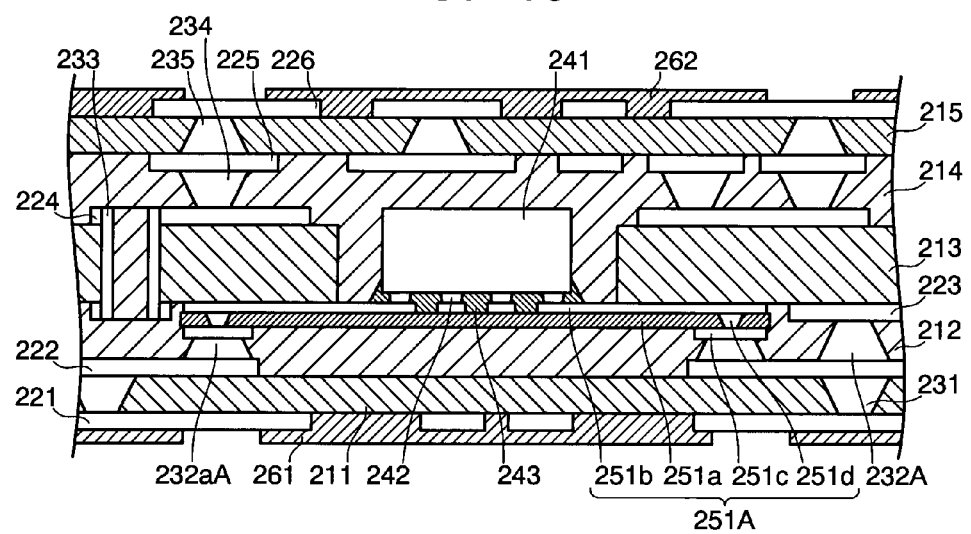
FIG. 19 is a sectional view schematically showing a structure of the component built-in wiring board according to still another (fourth) embodiment of the invention.

A component built-in wiring board according to still another embodiment of the invention is described with reference to FIG. 19. FIG. 19 is a sectional view schematically showing a structure of the component built-in wiring board according to another embodiment. In the drawing, like or equivalent constituents corresponding to those described above are denoted by like reference numerals, and descriptions thereof will be omitted unless it is necessary to add.

In this embodiment, as an intermediate mounted board one having an intermediate board 251A having an insulating plate 251a, a wiring pattern 251b, a rear surface wiring pattern 251c, and an interlayer connector 251d, on which the semiconductor chip 241 is mounted via the conductive bumps 242, is used. In addition, its position where it is embedded within the multilayer wiring board is almost near the boundary between the insulating layer 212 and the insulating layer 213. Further, the electrical connection between the intermediate mounted board and the inner layer is made via an interlayer connector 232aA, whose head is pressed against the rear surface wiring pattern 251c of the intermediate board 251A. The interlayer connector 232aA, is different from the case of the embodiment shown in FIG. 14 and has a small diameter at the top in the drawing. This situation is also applied to an interlayer connector 232A between the wiring layer 222 and the wiring layer 223.

Figure 20:
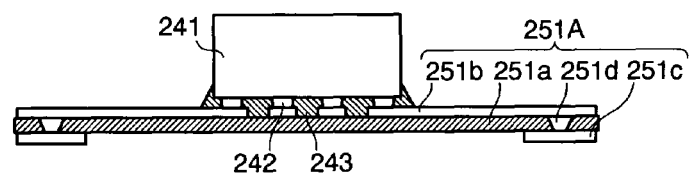
FIG. 20 is a sectional view schematically showing a structure of the intermediate mounted board shown in FIG. 19.

FIG. 20 is a sectional view schematically showing a structure of the intermediate mounted board shown in FIG. 19. In FIG. 20, like constituents corresponding to those shown in the drawing described above are denoted by like reference numerals. A method of forming the interlayer connector 251d used in the intermediate board 251A can be a method of using, for example, the conductive bumps obtained by screen printing the conductive composition onto the Cu foil (similar to the processes shown in FIG. 16A to FIG. 16C except that the insulating material is different). In the insulating plate 251a having the Cu foil on its both surfaces and having the interlayer connector 251d formed through it, the wiring patterns 251b and 251c can be obtained by performing a prescribed patterning of the Cu foil on its both surfaces.

Figure 21:
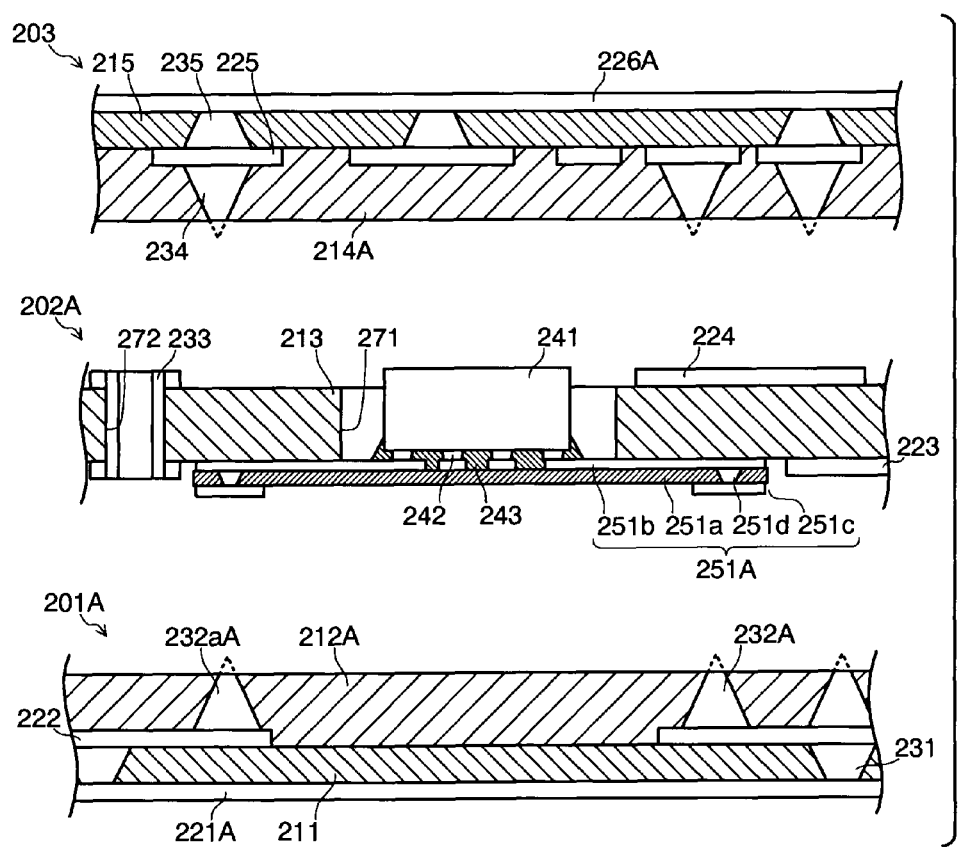
FIG. 21 is a process chart schematically showing in a sectional view part of the production process of the component built-in wiring board shown in FIG. 19.

FIG. 21 is a process chart schematically showing in a sectional view a part of the production process of the component built-in wiring board shown in FIG. 19. Specifically, it is a drawing showing an arrangement relationship of laminating the wiring board material and so forth, and corresponding to the process shown in FIG. 18 according to the above-described embodiment. In FIG. 21, like or equivalent constituents corresponding to those described above are denoted by like reference numerals.

As shown in FIG. 21, a wiring board material 202A, without lamination of the prepreg 212A and formation of the interlayer connectors 232 and 232a, is used in this embodiment. The intermediate mounted board of the intermediate board 251A is previously fixed to a prescribed position shown in the drawing. For fixing, an adhesive agent can be used. The wiring layer 223 is previously patterned so as not to contact with the wiring pattern 251b of the intermediate board 251A.

As for the wiring board material 201A, prepared is one provided with the prepreg 212A and the interlayer connectors 232A and 232aA,. Namely, the formation of the interlayer connectors 232A and 232aA, and the lamination of the prepreg 212A are performed previously on the wiring layer 222 (on the insulating layer 211) of the wiring board material 201 not having the intermediate mounted board. As a result, the wiring board material 201A has the same structure as that of the wiring board material 203.

The individual wiring board materials 201A, 202A and 203 are laminated in the arrangement as shown in FIG. 21 and then pressed and heated by a press machine. Thereby, the prepregs 212A and 214A are cured completely to be laminated and integrated wholly. At this time, flowability of the prepreg 212A or 214A resulting from heating makes the prepreg 212A or 214A deform and penetrate to fill the space around the semiconductor chip 241 and the space within the through hole conductor 233 without causing any void.

When laminated, the wiring layers 223 and 224 are pressed against the heads of the interlayer connectors 232A and 234 and electrically connected to them, respectively. At the same time, the rear surface wiring pattern 251c of the intermediate mounted board is pressed against the head of the interlayer connector 232aA, and electrically connected to it. Thus, the wiring pattern 251c in the intermediate mounted board as the built-in component is electrically conducted to the inner wiring layer 222 by the interlayer connector 232aA, formed simultaneously with the interlayer connector 232A as the multilayer wiring board, so that a new process does not arise for the electrical conduction. Therefore, contribution to the cost reduction is realized similarly to the previous embodiment.

Figure 22:
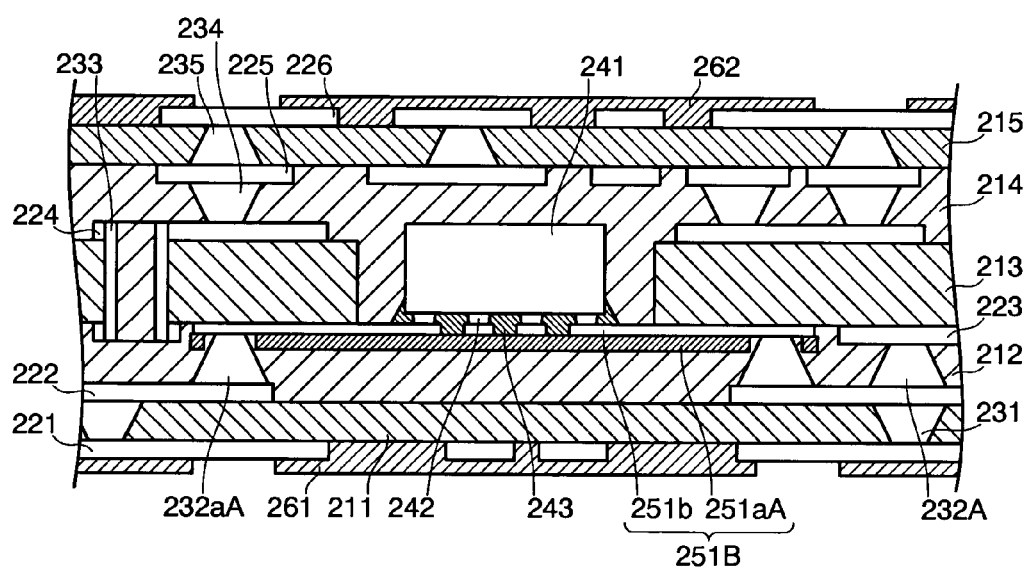
FIG. 22 is a sectional view schematically showing a structure of the component built-in wiring board according to still another (fifth) embodiment of the invention.

A component built-in wiring board according to still another embodiment of the invention is described with reference to FIG. 22. FIG. 22 is a sectional view schematically showing a structure of the component built-in wiring board according to still another embodiment. In the drawing, like or equivalent constituents corresponding to those described above are denoted by like reference numerals, and descriptions thereof will be omitted unless it is necessary to add.

In this embodiment, as an intermediate mounted board used is one having an intermediate board 251B having an insulating plate 251aA and the wiring pattern 251b, on which the semiconductor chip 241 is mounted via the conductive bumps 242. In addition, its position where it is embedded within the multilayer wiring board is almost near the boundary between the insulating layer 212 and the insulating layer 213 similar to the embodiment shown in FIG. 19. Further, the electrical connection between the intermediate mounted board and the inner layer is made via the interlayer connector 232aA, whose head is pressed against the rear surface side (surface opposite to the side where the semiconductor chip 241 is mounted) of the wiring pattern 251b of the intermediate board 251B. For this electrical connection, the insulating plate 251aA is penetrated through at the position where the head of the interlayer connector 232aA, is pressed.

Figure 23:
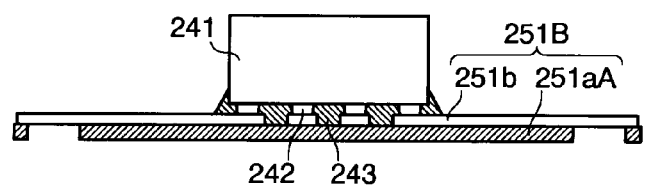
FIG. 23 is a sectional view schematically showing a structure of the intermediate mounted board shown in FIG. 22.

FIG. 23 is a sectional view schematically showing a structure of the intermediate mounted board shown in FIG. 22. In FIG. 23, like constituents corresponding to those shown in the drawing described above are denoted by like reference numerals. As a method of forming a through portion in the insulating plate 251aA of the intermediate board 251B, there can be adopted a method of, for example, etching or laser machining the prescribed portion from the rear surface side of the insulating plate 251aA after the pattern forming of the wiring pattern 251b.

Figure 24:
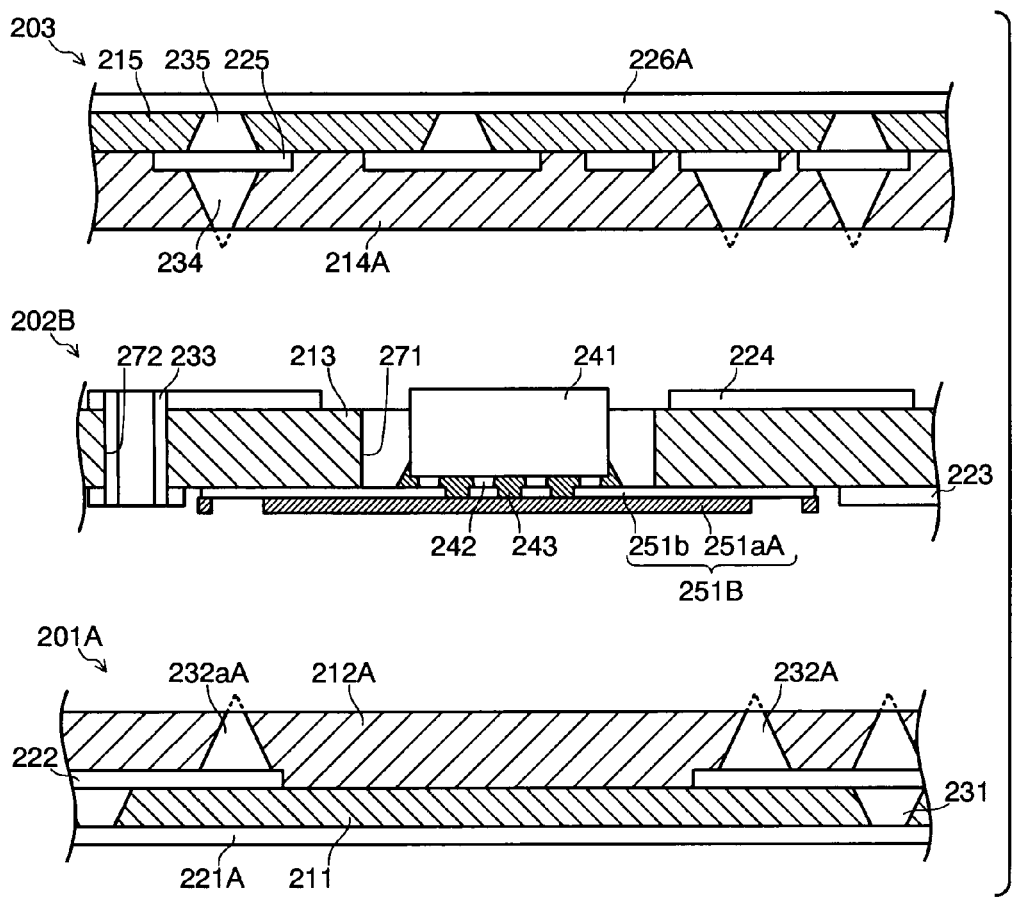
FIG. 24 is a process chart schematically showing in a sectional view part of the production process of the component built-in wiring board shown in FIG. 22.

FIG. 24 is a process chart schematically showing in a sectional view a part of a production process of the component built-in wiring board shown in FIG. 22. Specifically, it is a chart showing an arrangement relationship of laminating the wiring board material and so forth, and corresponding to the process shown in FIG. 18 or FIG. 21 according to the above-described embodiments. Like or equivalent constituents corresponding to those described above are denoted by like reference numerals in FIG. 24.

As shown in FIG. 24, the laminating process of this embodiment has a likeness to that shown in FIG. 21. As a wiring board material 202B, used is one shown in FIG. 23 in which the intermediate mounted board having the intermediate board 251B is previously fixed to the prescribed position. For fixing, an adhesive agent can be used. The wiring layer 223 is previously patterned so as not to contact with the wiring pattern 251b of the intermediate board 251B.

The wiring board material 201A is similar to that of the embodiment shown in FIG. 21. The individual wiring board materials 201A, 202B, and 203 are laminated in the arrangement as shown in FIG. 24 and then pressed and heated by a press machine. Thereby, the prepregs 212A and 214A are cured completely to be laminated and integrated wholly. At this time, flowability of the prepreg 212A or 214A resulting from heating makes the prepreg 212A or 214A deform and penetrate to fill the space around the semiconductor chip 241 and the space within the through hole conductor 233 without causing any void.

When laminated, the wiring layers 223 and 224 are pressed against the heads of the interlayer connectors 232A and 234 and electrically connected to them, respectively. At the same time, the rear surface side of the wiring pattern 251b of the intermediate mounted board is pressed against the head of the interlayer connector 232aA, and electrically connected to it. Thus, the wiring pattern 251b in the intermediate mounted board as the built-in component is electrically conducted to the inner wiring layer 222 by the interlayer connector 232aA, formed simultaneously with the interlayer connector 232A as the multilayer wiring board, so that a new process does not arise for the electrical conduction. Therefore, contribution to the cost reduction is realized similarly to the previous embodiments.

Figure 25:
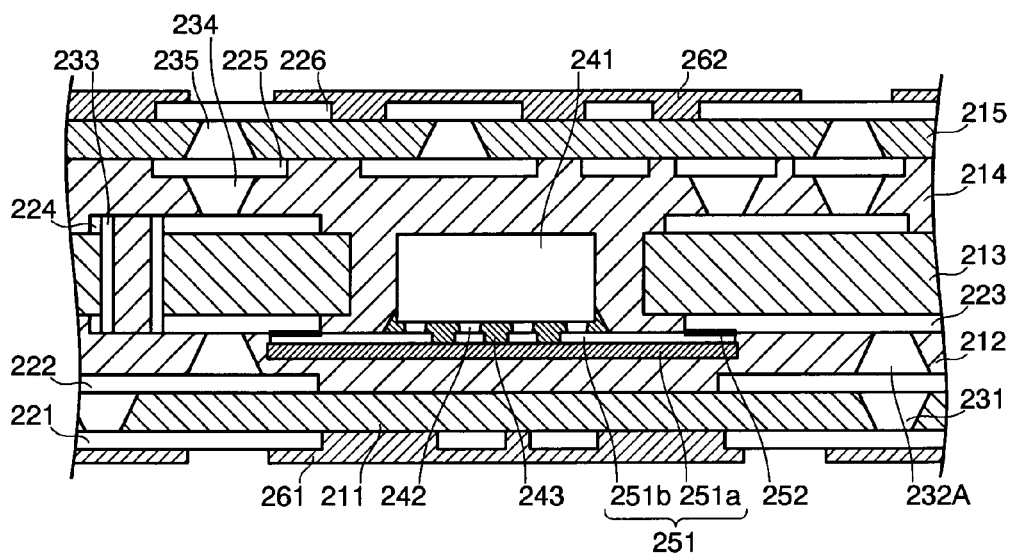
FIG. 25 is a sectional view schematically showing a structure of the component built-in wiring board according to still another (sixth) embodiment of the invention.

A component built-in wiring board according to still another embodiment of the invention is described with reference to FIG. 25. FIG. 25 is a sectional view schematically showing a structure of the component built-in wiring board according to still another embodiment. In the drawing, like or equivalent constituents corresponding to those described above are denoted by like reference numerals, and descriptions thereof will be omitted unless it is necessary to add.

In this embodiment, as the intermediate mounted board used is one having the intermediate board 251 having the insulating plate 251a and the wiring pattern 251b, on which the semiconductor chip 241 is mounted via the conductive bumps 242 (namely, having the same structure as that used in the embodiment shown in FIG. 14). In addition, its position where it is embedded within the multilayer wiring board is almost near the boundary between the insulating layer 212 and the insulating layer 213 similar to the embodiments shown in FIG. 19 and FIG. 22. Further, the electrical connection between the intermediate mounted board and the inner wiring layer is made via an anisotropic conductive film 252 formed between the wiring pattern 251b of the intermediate board 251 and the inner wiring layer 223.

Figure 26:
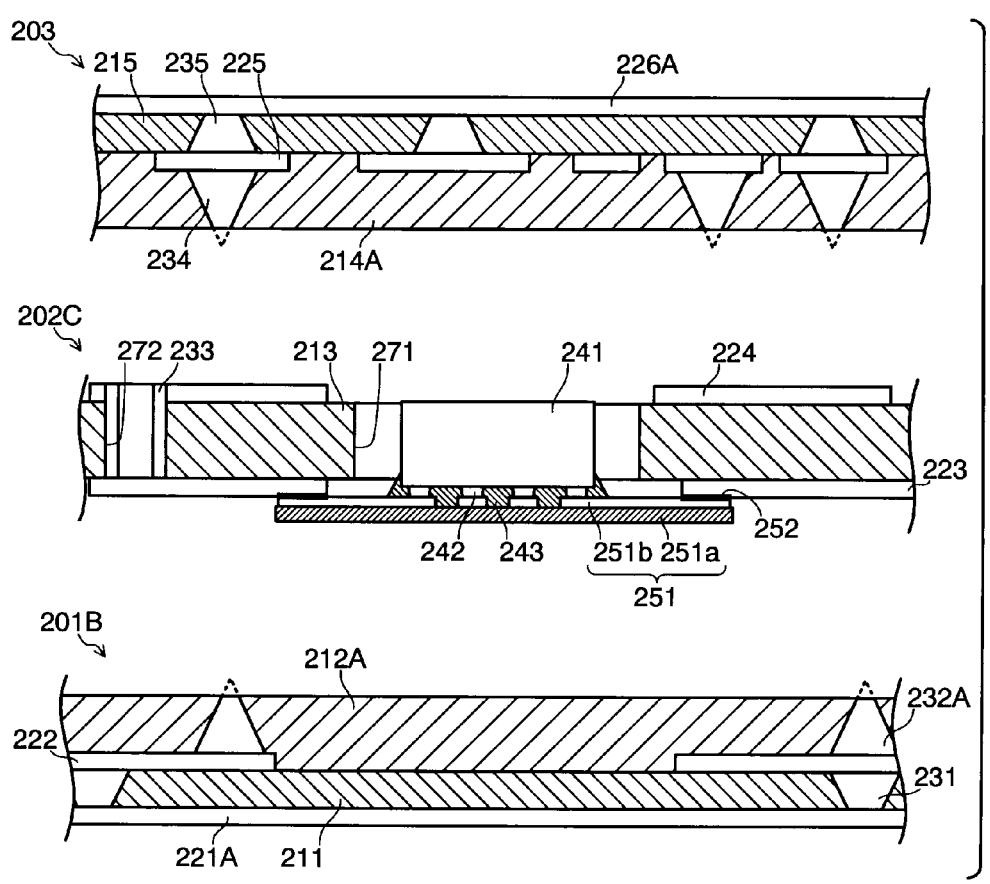
FIG. 26 is a process chart schematically showing in a sectional view part of the production process of the component built-in wiring board shown in FIG. 25.

FIG. 26 is a process chart schematically showing in a sectional view a part of the production process of the component built-in wiring board shown in FIG. 24. Specifically, it is a chart showing an arrangement relationship of laminating the wiring board material and so forth, and corresponding to the processes shown in FIG. 18, FIG. 21, or FIG. 24 according to the above-described embodiments. In FIG. 26, like or equivalent constituents corresponding to those described above are denoted by like reference numerals.

As shown in FIG. 26, the laminating process of this embodiment has a likeness to those shown in FIG. 21 or FIG. 24. As a wiring board material 202C, used is one to which the intermediate mounted board having the intermediate board 251 is previously fixed electrically and mechanically on the wiring layer 223 on the insulating layer 213 via the anisotropic conductive film 252. For fixing, a curable resin possessed by the anisotropic conductive film 252 itself can be used. Though a process is increased because it is necessary to align the wiring pattern 251b with the wiring layer 223, by alignment of pattern with pattern it becomes possible to connect finer patterns mutually, and their secure connection is realized. As the anisotropic conductive film 252, the general anisotropic conductive material (for example, an anisotropic conductive resin) can be used. Alternatively, a solder (cream solder in the manufacturing process) may be also used instead of the anisotropic conductive film 252.

As for wiring board material 201B, used is one not having interlayer connectors (interlayer connectors 232a and 232aA,) that are pressed against the wiring pattern 251b of the intermediate board 251. The rest is similar to the wiring board material 201A of the embodiments shown in FIG. 21 and FIG. 24. The individual wiring board materials 201B, 202C, and 203 are laminated in the arrangement as shown in FIG. 26 and pressed and heated by a press machine. Thereby, the prepregs 212A and 214A are cured completely to be laminated and integrated wholly. At this time, flowability of the prepreg 212A or 214A resulting from heating makes the prepreg 212A or 214A deform and penetrate to fill the space around the semiconductor chip 241 and the space within the through hole conductor 233 without causing any void. In addition, when laminated, the wiring layers 223 and 224 are pressed against the heads of the interlayer connectors 232A and 234 and electrically connected to them, respectively.

As a modification of the embodiment shown in FIG. 25 and FIG. 26, it may be considerable to obtain an embodiment similar to the embodiments shown in FIG. 19 and FIG. 22 in which an intermediate mounted board having the intermediate board 251A or 251B (instead of the the intermediate board 251) is used and the interlayer connector 232aA, is formed and used for electrical connection with the intermediate mounted board. Namely, in this case, electrical connection with the inner wiring layer 222 via the interlayer connector 232aA, is made on the side of the rear surface of the intermediate mounted board, and electrical connection with the inner wiring layer 223 via the anisotropic conductive film 252 or the solder is made on the side of the top surface of the intermediate mounted board.

Industrial Applicability

The component built-in wiring board according to the invention can be manufactured in the industry of manufacturing the wiring boards and also can be used in the industry of manufacturing a variety of electronic equipment. The manufacturing method of a component built-in wiring board according to the invention can be used in the industry of manufacturing wiring boards.

What is claimed is:

1. A component built-in wiring board, comprising:
a first insulating layer;
a second insulating layer positioned in a laminated state on the first insulating layer, the second insulating layer being a laminated layer of at least two insulating layers;
a semiconductor element buried in the second insulating layer, having a semiconductor chip with terminal pads and having surface mounted terminals arrayed in a grid shape connected electrically with the terminal pads;
an electric/electronic component further buried in the second insulating layer, having terminals on both sides thereof;
a first wiring pattern sandwiched between the first insulating layer and the second insulating layer, including a first mounting land for the semiconductor element and a second mounting land for the electric/electronic component;
a first connecting member connecting electrically the surface mounting terminal of the semiconductor element with the first mounting land;
a second connecting member connecting electrically the terminals of the electric/electronic component with the second mounting land, made of a same material as a material of the first connecting member;
a second wiring pattern sandwiched between the at least two insulating layers; and
an interlayer connector sandwiched between a surface of the first wiring pattern and a surface of the second wiring pattern to penetrate partly through the second insulating layer in a layered direction, made of a conductive composition and having a shape with an axis corresponding to the layered direction and a diameter varying in an axial direction.

2. The component built-in wiring board according to claim 1, wherein the first connecting member and the second connecting member are solders mainly consisting of tin.

3. The component built-in wiring board according to claim 1, wherein the first connecting member and the second connecting member are solders having a microstructure resulting from copper particles and mainly consisting of tin.

4. The component built-in wiring board according to claim 1, wherein the first connecting member and the second connecting member are conductive compositions.

5. The component built-in wiring board according to claim 1, wherein the electrical connection between the surface mounting terminal of the semiconductor element and the terminal pads is made by a rewiring layer formed on the semiconductor chip.

6. The component built-in wiring board according to claim 1, wherein the semiconductor element has a thickness smaller than a height of the electric/electronic component.

7. The component built-in wiring board according to claim 1, wherein the surface mounting terminal of the semiconductor element is an LGA terminal.

8. The component built-in wiring board according to claim 1, wherein the surface mounting terminal of the semiconductor element has a Ni/Au plated layer as a surface layer.

9. The component built-in wiring board according to claim 1, wherein the surface mounting terminal of the semiconductor element has a tin plated layer as a surface layer.

10. The component built-in wiring board according to claim 1, wherein the surface mounting terminal of the semiconductor element has Cu as a surface layer.

* * * * *